United States Patent
Kobayashi et al.

(10) Patent No.: US 8,129,611 B2
(45) Date of Patent: *Mar. 6, 2012

(54) LIGHT-SCATTERING FILM AND OPTICAL DEVICE USING THE SAME

(75) Inventors: Yasuyuki Kobayashi, Kanagawa (JP); Satoshi Sakai, Kanagawa (JP); Koji Satake, Kanagawa (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 982 days.

This patent is subject to a terminal disclaimer.

(21) Appl. No.: 11/296,706

(22) Filed: Dec. 8, 2005

(65) Prior Publication Data

US 2006/0137735 A1    Jun. 29, 2006

(30) Foreign Application Priority Data

Dec. 10, 2004    (JP) .................. 2004-359114

(51) Int. Cl.
    *H01L 31/00*    (2006.01)
(52) U.S. Cl. ....................... 136/252; 136/246
(58) Field of Classification Search ............ 136/252
    See application file for complete search history.

(56) References Cited

U.S. PATENT DOCUMENTS

| | | | | |
|---|---|---|---|---|
| 4,166,919 A | * | 9/1979 | Carlson | 136/257 |
| 5,421,909 A | * | 6/1995 | Ishikawa et al. | 136/256 |
| 5,656,098 A | | 8/1997 | Ishikawa et al. | |
| 5,720,827 A | | 2/1998 | Simmons | |
| 5,770,216 A | * | 6/1998 | Mitchnick et al. | 428/402 |
| 2002/0134425 A1 | * | 9/2002 | Yamamoto et al. | 136/255 |
| 2006/0049745 A1 | | 3/2006 | Handa et al. | |
| 2006/0090790 A1 | | 5/2006 | Kobayashi et al. | |

FOREIGN PATENT DOCUMENTS

| | | |
|---|---|---|
| EP | 0 357 289 A2 | 3/1990 |
| EP | 0 559 141 | 9/1993 |
| EP | 0 757 262 | 2/1997 |
| EP | 1 058 320 | 12/2000 |
| JP | 01-106472 | 4/1989 |

(Continued)

OTHER PUBLICATIONS

Noguchi Shigeru, Sano Keiichi and Iwata Hiroshi, Machine translation JP05-075154, 1993.*

(Continued)

*Primary Examiner* — Alexa Neckel
*Assistant Examiner* — Miriam Berdichevsky
(74) *Attorney, Agent, or Firm* — Westerman, Hattori, Daniels & Adrian, LLP

(57) ABSTRACT

A light scattering film having the structure which guides electrical signal to a desired position and scatters incident light and the surface of which is substantially flat, and a photoelectric device using the same. The light scattering film includes a medium made of transparent conductive material and a light scatterer embedded in the medium. The light scattering film realizes conductivity and the light-scattering characteristic by single component. It is not necessary to make the texture of a surface with concavity and convexity deliberately to achieve the light-scattering characteristic. Desirably, the surface is substantially flat. When a semiconductor layer is formed on the surface, the defects are suppressed because of the flatness of the surface. The photoelectric device having the light scattering film and the semiconductor device on the surface of the film can achieve high photoelectric conversion efficiency.

31 Claims, 22 Drawing Sheets

FOREIGN PATENT DOCUMENTS

| | | |
|---|---|---|
| JP | 1-106472 | 4/1989 |
| JP | 05-075154 A | 3/1993 |
| JP | 5-335610 A | 12/1993 |
| JP | 6-313890 | 11/1994 |
| JP | 07-202231 A | 8/1995 |
| JP | 08-018084 A | 1/1996 |
| JP | 10-326903 A | 12/1998 |
| JP | 2862174 | 12/1998 |
| JP | 11-135817 A | 5/1999 |
| JP | 11-323196 | 11/1999 |
| JP | 2000-114562 A | 4/2000 |
| JP | 2000-128581 A | 5/2000 |
| JP | 2000-150928 A | 5/2000 |
| JP | 2000-183376 A | 6/2000 |
| JP | 2000-357807 A | 12/2000 |
| JP | 2002-222975 | 8/2002 |
| JP | 2003-179241 A | 6/2003 |
| JP | 2003-243676 | 8/2003 |
| JP | 2003-298088 A | 10/2003 |
| JP | 2004-271600 | 9/2004 |
| JP | 2004-303724 | 10/2004 |
| WO | WO88/09265 | 12/1988 |

OTHER PUBLICATIONS

European Search Report, dated Mar. 3, 2006, issued in corresponding European application No. 05 11 1652.

Yoshiyuki Nasuno et al., "Effect of Substrate Surface Morphology on Microcrystalline Silicon Solar Cells", Jpn. J. Appl. Phys., The Japan Society of Applied Physics, Apr. 1, 2001, vol. 40, pp. L303-L305.

Chinese Office Action mailed Jun. 6, 2008, issued in corresponding Chinese Application No. 200510009428.3.

Yoshiyuki Nasuno et al. "Effects of Substrate Surface Morphology on Microcrystalline Silicon Solar Cells", Japan J. Appl. Phys. (2001) vol. 40, pp. L303-L305.

Japanese Office Action dated Jan. 13, 2009, issued in corresponding Japanese Application No. 2004-316446.

Japanese Office Action dated Jan. 26, 2010, issued in corresponding Japanese Patent Application No. 2004-316446.

Japanese Office Action dated Jan. 5, 2010, issued in corresponding Japanese Patent Application No. 2004-359114 (With English Translation).

\* cited by examiner

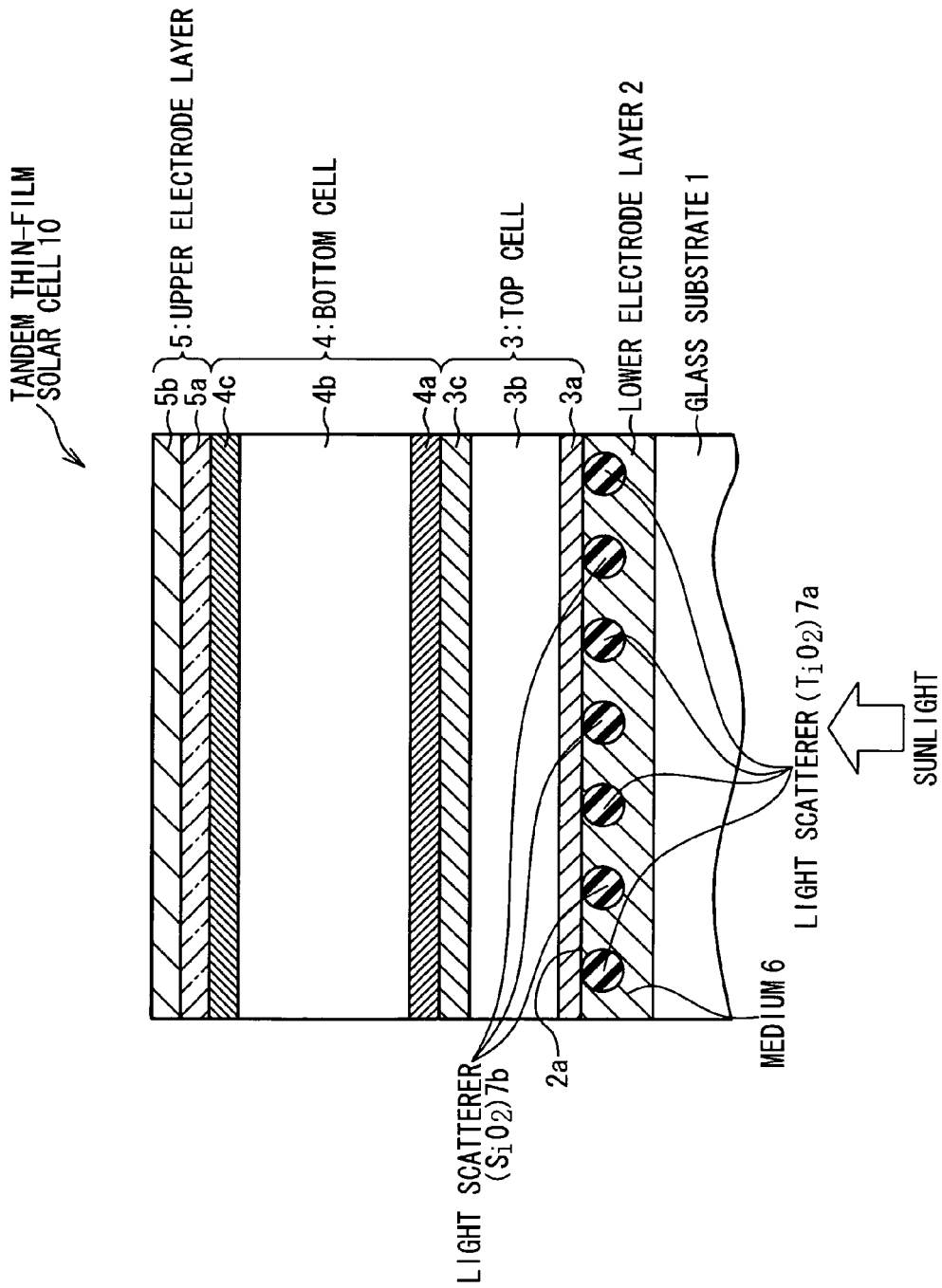

LIGHT-SCATTERING FILM AND OPTICAL DEVICE USING THE SAME

BACKGROUND OF THE INVENTION

1. Field of the Invention

The present invention relates to a light-scattering film and an optical device using the same.

2. Description of the Related Art

One of the devices sustaining the modern life is an optical device that realizes desired functions by utilizing the mutual conversion between electricity and light. A photoelectric conversion device (for example, a solar cell), a light-emitting device (for example, an electroluminescent element exemplified by a light-emitting diode and an OLED (organic light emitting diode)), and a liquid crystal element (for example, a liquid crystal display panel), are typical optical devices. Such optical devices are indispensable to the modern daily life.

An optical device includes a conductive structure member for guiding an electrical signal (for example, an electric current and a voltage) to a desired position, and a structure member for scattering light. For example, Japanese Laid Open Patent Application JP-A-Heisei, 6-313890 discloses a back electrode plate for a liquid crystal display device, provided with a metal reflective layer, an insulating light-scattering layer formed thereon, and a transparent electrode for coating the light-scattering layer. Further, Japanese Laid Open Patent Application JP-A-Heisei, 11-323196 discloses a reflective liquid crystal display device provided with a light-scattering layer in which a transparent resin is mixed with a light scatterer (see FIG. 1). In the reflective liquid crystal display device, the transparent electrode to which the electrical signal is applied, and the light-scattering layer are prepared separately. The Japanese Laid Open Patent Application JP-A-Heisei, 11-323196 further discloses that a light-scattering effect of the light-scattering layer can be improved by mixing spacer grains having a refractive index close to the transparent resin in order to provide a distance between transparent grains, which are the light scatterers (for example, the paragraph [0011]). In addition, Japanese Laid Open Patent Application JP-P2004-271600A discloses optical material in which the scatterers are distributed randomly, having an isotropic photonic gap with a large energy width that is less subjective to non-uniformity of the scatterers and a position deviation of the scatterers, and being capable of making a light guide and cavity of any shape.

To simplify the configuration of the optical device, it is preferable that the both functions of leading the electrical signal to a desired position and of scattering the light, are realized by a single structure member. One of such structures is a transparent electrode formed in a textured form (that is, with concavities and convexities), as shown in Japanese Laid Open Patent Application JP-P2004-271600A, Japanese Patent 2862174, Japanese Laid Open Patent Application JP-P2003-243676A. In Patent Documents 3 to 5, the transparent electrode formed in the textured form is used as an electrode on the side of a substrate of a photoelectric conversion device. Usage of the transparent electrode formed in the textured form, as the electrode on the side of the substrate, is one of the effective techniques to improve the conversion efficiency of the photoelectric conversion device. The transparent electrode formed in the textured form scatters incident light directed to the photoelectric conversion device, and effectively improves a light absorption amount, namely, the conversion efficiency. Further, in Japanese Laid Open Patent Application JP-P2002-222975A, a technique for resolving the trade-off between the advantages of optical and electrical characteristics by using the textured form conductive material is disclosed.

As methods to form a transparent electrode of the textured form, the following three methods are known. According to a first method, the transparent electrode is formed by using a thermal CVD (Chemical Vapor Deposition) method, as disclosed in Japanese Laid Open Patent Application JP-A-Heisei, 6-313890. By optimizing growth conditions, the transparent electrode of the textured form can be formed by using the thermal CVD method. According to a second method disclosed in Japanese Laid Open Patent Application JP-P2004-271600A, a surface of a glass substrate is polished and a transparent electrode is formed on the polished surface. A third method disclosed in Japanese Laid Open Patent Application JP-A-Heisei 11-323196 is a method by which a thin film is formed by insulating microparticles and binders on the substrate, and the transparent electrode is formed on the thin film.

However, undesired effect may also be generated if the concavities and convexities are provided to a conductive material for the purpose of scattering the light. For example, in the photoelectric conversion device, the usage of the transparent electrode formed in the textured form, as the electrode on the side of the substrate, induces defects to a semiconductor thin film formed thereon. This indicates that the improvement of the conversion efficiency of the photoelectric conversion device is limited, in the technique using the transparent electrode formed in the textured form as the electrode on the side of the substrate (see Yoshiyuki Nasuno et al., "Effects of Substrate Surface Morphology on Microcrystalline Silicon Solar Cells", Jpn. J. Appl. Phys., The Japan Society of Applied Physics, 1 Apr. 2001, vol 40, pp. L303-L305.). If the concavities and convexities of the transparent electrode are enhanced, the light absorption of a semiconductor layer can be increased. However, the enhancement in the concavities and convexities of the transparent electrode increases the defects induced to the semiconductor thin film, and decreases an output voltage. Therefore, there is a limit to the improvement of the conversion efficiency realized by forming the concavities and convexities to the transparent electrode.

As a result, it is required to provide a technique for providing both the functions of guiding the electrical signal to the desired position and of scattering the light, with a single structure member with less concavities and convexities on a surface (the surface ideally is flat). Provision of such technique will also be effective to improve the conversion efficiency of the photoelectric conversion device, for example.

According to the present invention, it is possible to provide a technique for providing both functions of leading an electrical signal to a desired position and of scattering light, with a single structure with less concavities and convexities on a surface (the surface ideally is flat).

Furthermore, it is possible to further improve the conversion efficiency of a photoelectric conversion device by applying the present invention to the photoelectric conversion device.

SUMMARY OF THE INVENTION

Therefore, an object of the present invention is to provide a technique for providing the both functions of guiding the electrical signal to a desired position and of scattering the light, with a single structure with less concavities and convexities on a surface (the surface ideally is flat).

Another object of the present invention is to provide a new technique for improving the conversion efficiency of the photoelectric conversion device.

BRIEF DESCRIPTION OF THE DRAWINGS

FIG. 7 is a sectional view showing a configuration of a tandem thin-film solar cell in another embodiment of the photoelectric conversion device according to the present invention;

DESCRIPTION OF THE PREFERRED EMBODIMENTS

A light-scattering film in an embodiment of the present invention includes a medium 6 that is transparent and conductive, and a light scatterer 7 embedded in the medium 6. For the medium 6, a material widely used as a transparent electrode, as exemplified by tin oxide, zinc oxide, indium oxide, and ITO (Indium Tin Oxide), may be used. For the light scatterer 7, a material having a relative refractive index different from that of the medium 6, is used. More specifically, when tin oxide, zinc oxide, indium oxide or ITO is used for the medium 6, the following are preferably used for the light scatterer 7: titanium oxide (with a relative refractive index of 2.2 to 2.3); diamond (with a relative refractive index of 2.1 to 2.2); SiO2 (glass) (with a relative refractive index of 1.53); $MgF_2$ (with a relative refractive index of 1.29); MgO (with a relative refractive index of 1.73); ZnO (with a relative refractive index of 1.88); LiTaO$_3$ (with a relative refractive index of 2.18), and so on.

Such light-scattering film has conductivity by the medium 6 being conductive. The light-scattering film further has a function of scattering the light by the light scatterer 7. In the case of the light-scattering film, it is not necessary to form the concavities and convexities on the surface. Thus, the light-scattering film in FIG. 1 makes it possible to realize the both functions of guiding the electrical signal to a desired position and of scattering the light, with a single structure member having less concavities and convexities on the surface (the surface ideally is flat).

Figure 2:
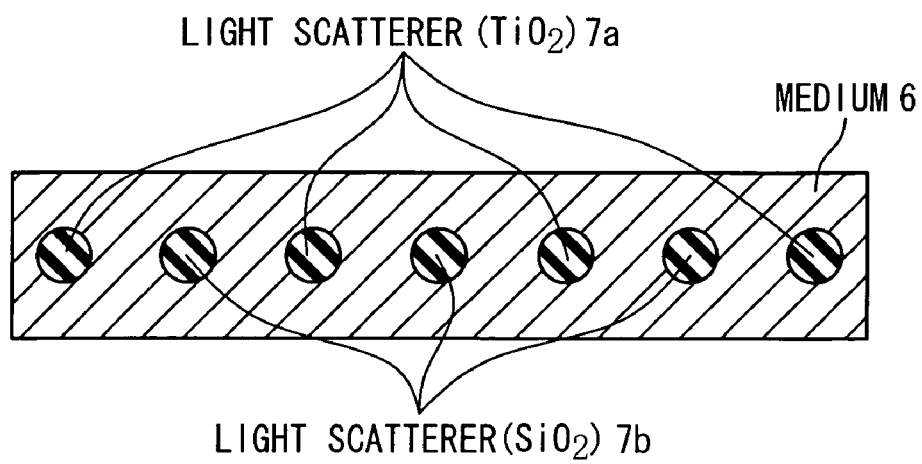
FIG. 2 is a sectional view showing another embodiment of the light-scattering layer according to the present invention.

In order to scatter the light more efficiently, it is preferable that the light scatterer 7 has two or more kinds of materials having a relative refractive index different from each other. For example, as shown in FIG. 2, the light scatterer 7 preferably has a light scatterer 7a made of titanium oxide, and a light scatterer 7b made of SiO$_2$ (glass) By using the light scatterer 7 including different materials, a probability of a direct contact of the light scatterer 7 to each other having the same refractive index, is suppressed, and the incident light can be scattered more efficiently.

The embodiment of the configuration of a light-scattering film, and an optical device using the light-scattering film according to the present invention are described as follows.

First Embodiment

Figure 3:
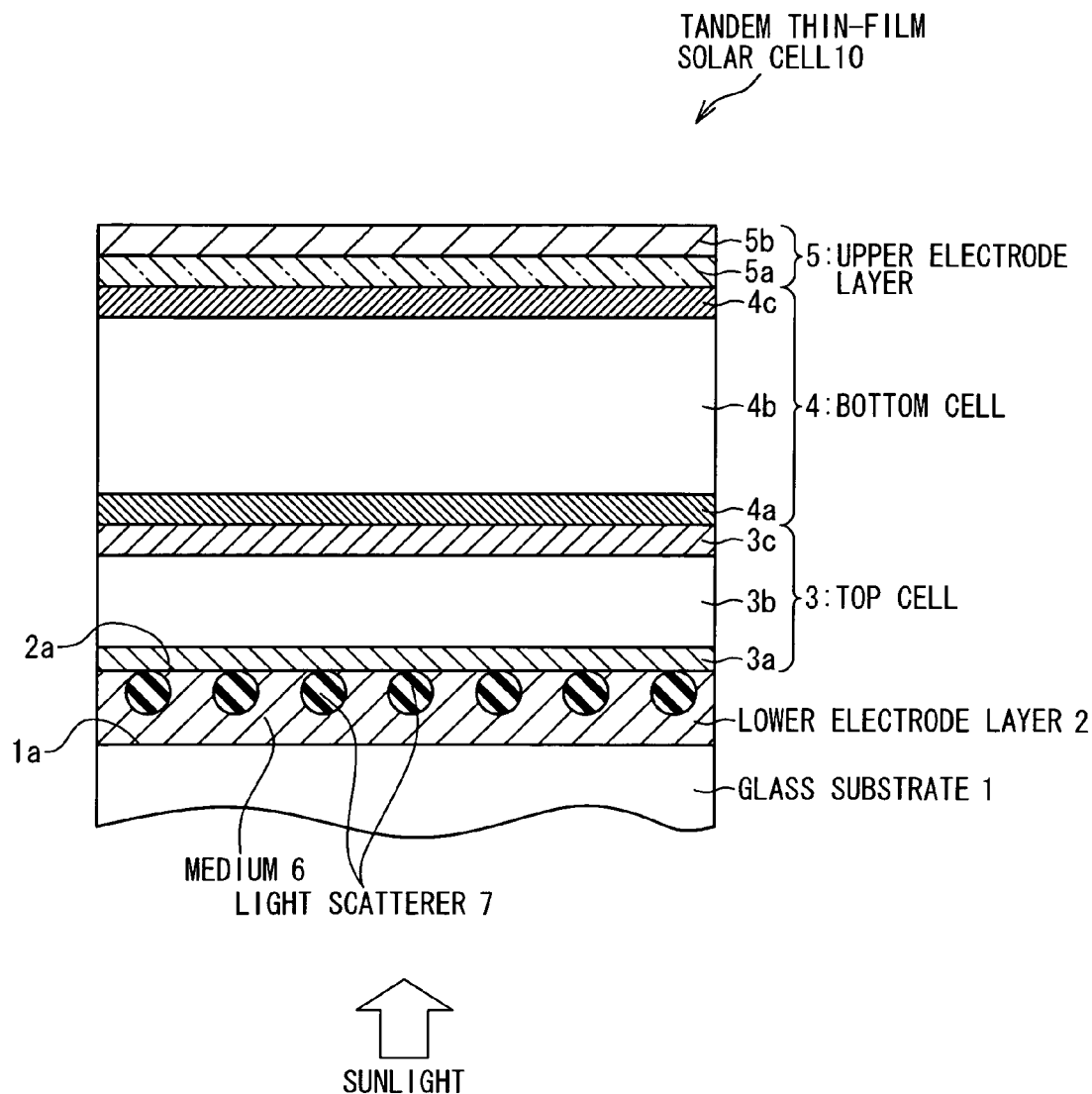
FIG. 3 is a sectional view showing a configuration of a tandem thin-film solar cell in an embodiment of a photoelectric conversion device according to the present invention.

In the first embodiment, a light-scattering film of the present invention is used as a transparent electrode of a photoelectric conversion device. In the embodiment, a tandem thin-film solar cell 10 is configured with a glass substrate 1, and is further configured with a lower electrode layer 2, a top cell 3, a bottom cell 4, and an upper electrode layer 5, which are formed in order on a principal surface 1a of the glass substrate 1, as shown in FIG. 3. The top cell 3 includes a p-type amorphous silicon layer 3a, an i-type amorphous silicon layer 3b, and an n-type amorphous silicon layer 3c, which are formed in order on the lower electrode layer 2. The bottom cell 4 includes a p-type microcrystalline silicon layer 4a, an i-type microcrystalline silicon layer 4b, and an n-type microcrystalline silicon layer 4c, which are formed in order on the top cell 3. The upper electrode layer 5 includes a ZnO layer 5a formed on the bottom cell 4, and an Ag layer 5b formed on the ZnO layer 5a. The ZnO layer 5a is doped with Ga.

In the tandem thin-film solar cell 10 of this embodiment, the light-scattering film of the present invention is used as the lower electrode layer 2. Namely, the lower electrode layer 2 is formed by the medium 6 made of a transparent conductive material, and the light scatterer 7 embedded in the medium 6. The light scatterer 7 scatters incident light incident through the glass substrate 1, and prompts light absorption of the top cell 3 and the bottom cell 4. That is, in the tandem thin-film solar cell 10 of this embodiment, it is not necessary to provide the lower electric layer 2 with concavities and convexities for scattering the incident light, since the lower electric layer 2 formed by the medium 6 in which the light scatterer 7 is embedded is used. This makes it possible to improve the conversion efficiency while suppressing the generation of defects in a semiconductor layer forming the top cell 3 and the bottom cell 4.

Figure 4:
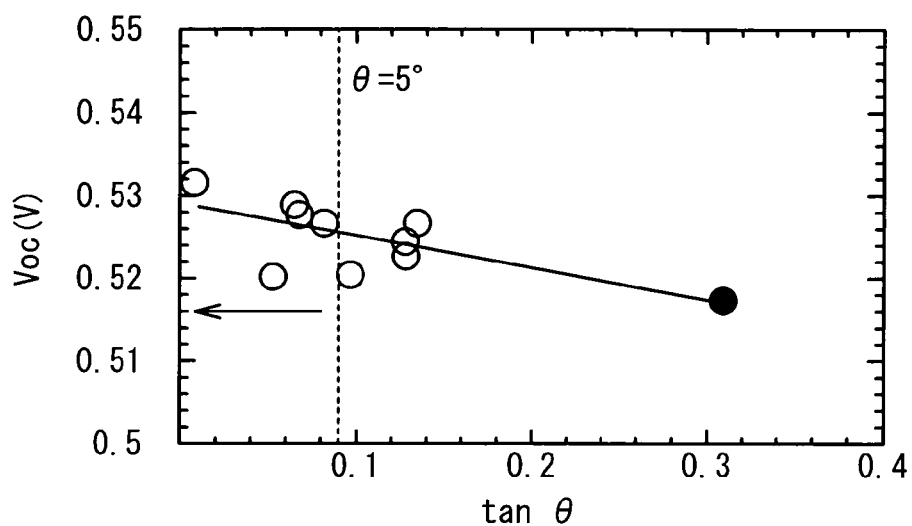
FIG. 4 is a graph showing the relationship between flatness of a lower electrode layer in the tandem thin-film solar cell and an open voltage.

Different from the photoelectric conversion device disclosed in the conventional arts, the lower electrode layer 2 of this embodiment is not deliberately provided with the concavities and convexities for improving the conversion efficiency. A surface 2a of the lower electrode layer 2 contacting the top cell 3 is substantially flat. The expression "substantially flat" means a state in which an average value θ of an angle between the surface 2a of the lower electrode layer 2 and the principal surface 1a of the glass substrate 1 is 5 degrees or below, the angle being defined in any cross section having a length of 300 to 1200 nm in a direction parallel to the principal surface of the glass substrate 1. Flatness of such degree as defined in the foregoing, does not induce the decreasing of an open voltage that leads to the defects in a silicon layer. This is demonstrated by a graph in FIG. 4, the graph showing the relationship between the average value θ and the open voltage. As is understood from FIG. 4, the open voltage is not decreased when the average value θ is 5 degrees or below.

Detailed description is given below, on preferable physical characteristics and configurations of the medium 6 and the light scatterer 7 forming the lower electrode layer 2.

For the medium 6 in the lower electrode layer 2, a conventional material widely used as a transparent electrode, as exemplified by tin oxide, zinc oxide, indium oxide, and ITO (Indium Tin Oxide), may be used.

For the light scatterer 7, a material having a relative refractive index different from the medium 6, is used. A material forming the light scatterer 7 is selected from materials having an absolute value of 2 or below, which is the absolute value of the difference between a relative refractive index of the material forming the light scatterer 7 and that of the medium 6. More specifically, when tin oxide, zinc oxide, indium oxide or ITO is used for the medium 6, the following are preferably used for the light scatterer 7: titanium oxide (with a relative refractive index of 2.2 to 2.3); diamond (with a relative refractive index of 2.1 to 2.2); SiO$_2$ (glass) (with a relative refractive index of 1.53); MgF$_2$ (with a relative refractive index of 1.29), MgO (with a relative refractive index of 1.73), ZnO (with a relative refractive index of 1.88), LiTaO$_3$ (with a relative refractive index of 2.18), and so on.

A conductive material does not need to be used for the light scatterer 7. Rather, it is preferable that an insulating material is used for the light scatterer 7 in order to suppressing the light absorption by the light scatterer 7. Usage of the insulating material having a fewer number of free electrons as the light scatterer 7 is effective for the suppressing of the light absorption by the light scatterer 7. On the other hand, the usage of the insulating material as the light scatterer 7, does not prevent a flow of photoelectric currents, since the photoelectric currents generated by the top cell 3 and the bottom cell 4 are flowed through the medium 6.

Figure 5:
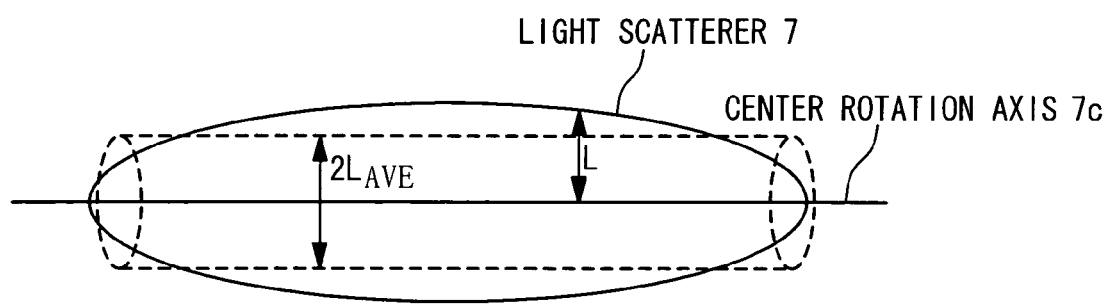
FIG. 5 is a diagram describing a definition of an outer diameter of a spheroid.

The size of the light scatterer 7 is one of the important parameters determining a degree of the scattering of the incident light. When the shape of the light scatterer 7 is approximated by a spheroid as shown in FIG. 5, an average value of an outer diameter of the light scatterer 7 is preferably in a range of 60 nm to 2000 nm, and more preferably, in a range of 60 nm to 1200 nm. Here, the outer diameter of the light scatterer 7 is a parameter defined as a value two times an average L$_{AVE}$ of a distance L from a center rotation axis 7c to a surface of the light scatterer 7.

When a structure shaped to have a center like a sphere and a regular polyhedron, is used for the light scatterer 7, an average diameter of the light scatterer 7 is preferably in a range of 10 nm to 2000 nm, and more preferably, in a range of 60 nm to 1200 nm. Here, the diameter of a light scatterer 7 is defined as a value two times the average of the distance from the center to the surface of the light scatterer 7, and the average diameter is an average of the diameter of the light scatterer 7 defined as the forgoing. By setting the average diameter of the light scatterer 7 to the range mentioned above, it is possible to more effectively scatter the light in a light wavelength region used for the tandem thin-film solar cell 10 to generate electric power, and the efficiency of the tandem thin-film solar cell 10 can also be improved.

In addition, an average pitch of the light scatterer 7 is preferably 4000 nm or below. More preferably, the average pitch of the light scatterer 7 is a value equal to or below two times 1200 nm, 1200 nm being a high value of the light wavelength region used for the tandem thin-film solar cell 10 to generate the electric power, namely, 2400 nm or below. Here, the pitch of the adjacent light scatterer 7 is a distance between the centers of the adjacent members of light scatterer 7, and the average pitch is the average of the pitch of the light scatterer 7. By setting the average pitch of the light scatterer 7 to the range mentioned above, it is possible to more effectively scatter the light in the light wavelength region used for the tandem thin-film solar cell 10 to generate the electric power, and the efficiency of the tandem thin-film solar cell 10 can also be improved.

Also, a ratio $\delta_{AVE}/d_{AVE}$ of an average pitch $\delta_{AVE}$ to an average diameter $d_{AVE}$ of the light scatterer 7 preferably is 20 or below, and more preferably is 4 or below. By setting the ratio $\delta_{AVE}/d_{AVE}$ to the range mentioned above, it is possible to more effectively scatter the light in the light wavelength region used for the tandem thin-film solar cell 10 to generate the electric power, and the efficiency of the tandem thin-film solar cell 10 can also be improved.

A distance between the surface 2a of the lower electrode layer 2 on the side of the top cell 3, and the light scatterer 7, preferably is less than 50 nm, and more preferably is less than 30 nm. Most preferably, the light scatterer 7 is in contact with the surface 2a. FIG. 3 shows a configuration in which the light scatterer 7 is in contact with the surface 2a. By making the distance between the light scatterer 7 and the surface 2a small, it is possible to confine the light incident to the top cell 3 and the bottom cell 4 within the top cell 3 and the bottom cell 4, to improve the conversion efficiency.

It is preferable that the light scatterer 7 is provided as regularly as possible. More specifically, the difference between a maximum value and a minimum value of the distance between the light scatterer 7 and the surface 2a of the lower electrode layer 2 on the side of the top cell 3 (namely, a depth in which the light scatterer 7 is embedded), preferably is 30 nm or below, which is a tenth of 300 nm, 300 nm being a low value of the light wavelength region used for the tandem tin-film solar cell 10 to generate the electric power.

Also, as shown in FIG. 5, when the light scatterer 7 is approximated by the spheroid, the difference between the maximum value and the minimum value of the outer diameter of the light scatterer 7 is preferably 120 nm or below, which is a tenth of 1200 nm, 1200 nm being the high value of the light wavelength region used for the tandem thin-film solar cell 10 to generate the electric power. Similarly, when the light scatterer 7 is the structure having the center, the difference between the maximum value and the minimum value of the diameter of the light scatterer 7 is 120 nm or below. The impact of variations in the size of the light scatterer 7 on the conversion efficiency is less than the impact of the depth in which the light scatterer 7 is embedded, on the conversion efficiency. As a result, wider variations are allowed for the diameter of the light scatterer 7 than for the depth in which the light scatterer 7 is embedded. Similarly, the difference between the maximum value and the minimum value of the pitch of the light scatterer 7 is preferably 120 nm or below.

The lower electrode layer 2 in which the light scatterer 7 is embedded in the medium 6, is preferably formed by using a method selected from a CVD method, a sputtering method, an ion plating method, and a sol-gel method at a previous stage, and by using a sol-gel method at a latter stage. When the sol-gel method is used at the latter stage, the light scatterer 7 can easily be dispersed into the medium 6, if the light scatterer 7 is mixed into a precursor solution of the medium 6 beforehand.

Figure 6A:
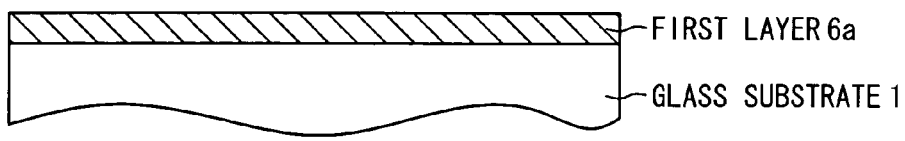
FIG. 6A is a sectional view showing a preferable manufacturing process of the lower electrode layer in the tandem thin-film solar cell.
Figure 6B:
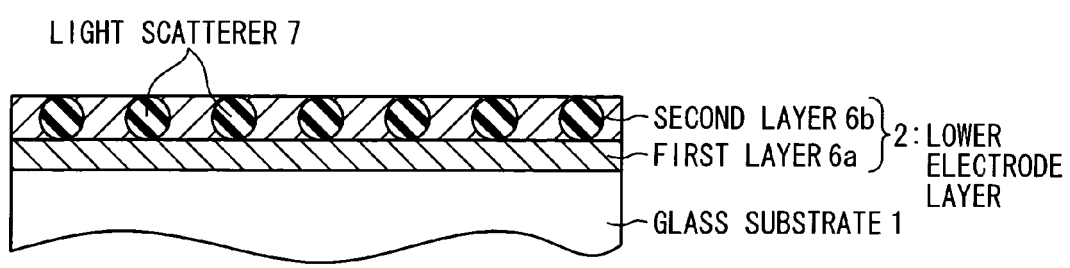
FIG. 6B is a sectional view showing a preferable manufacturing process of the lower electrode layer in the tandem thin-film solar cell.

FIGS. 6A and 6B are sectional views showing a preferable forming process of the lower electrode layer 2. First, as shown in FIG. 6A, a first layer 6a of the same material as the medium 6, is formed on the principal surface 1a of the glass substrate 1, by using a method selected from the CVD method, the sputtering method, the ion plating method, and the sol-gel method. More specifically, a thin layer of the medium 6 is directly formed in the case of the CVD method, the sputtering method or the ion plating method. In the case of the sol-gel method, a solution containing a precursor of the medium 6 is applied to the glass substrate 1, and then the first layer 6a is formed by sintering the precursor solution. Since experience shows that a performance of the medium 6 in the case of the CVD method, the sputtering method, and the ion plating method, is higher than in the case of the sol-gel method, the formation of the first layer 6a is preferably carried out by using the CVD method, the sputtering method or the ion plating method. Next, as shown in FIG. 6B, a second layer 6b is formed by using the sol-gel method. More in detail, a solution in which the precursor of the medium 6, and the light scatterer 7 are mixed, is applied to the glass substrate 1, and then the second layer 6b is formed by sintering the solution. With such forming process, it is possible to form the lower electrode layer 2 having the configuration in which the light scatterer 7 is located in the vicinity of the surface 2a. If viscosity of the precursor solution used for the formation of the second layer 6b is adjusted such that a thickness of the second layer 6b corresponds to the diameter of the light scatterer 7, the light scatterer 7 can ideally be positioned to come in contact with the surface 2a of the lower electrode layer 2.

Preferred Modification of the First Embodiment

In order to more effectively scatter the incident light in the case of the lower electrode layer 2 being formed by using the sol-gel method, the lower electrode layer 2 preferably contains the light scatterer 7 formed by a first material, and a second material having a relative refractive index different from the first material forming the light scatterer 7, as described above with reference to FIG. 2. For example, as shown in FIG. 7, the light scatterer 7 is preferably formed by the light scatterer 7a made of titanium oxide, and the light scatterer 7b made of $SiO_2$ (glass). Usage of the light scatterer 7 including the different materials makes it possible to suppress the probability that the light scatterer 7 having the same refractive index come into direct contact with each other, and to more effectively scatter the incident light.

Figure 8:
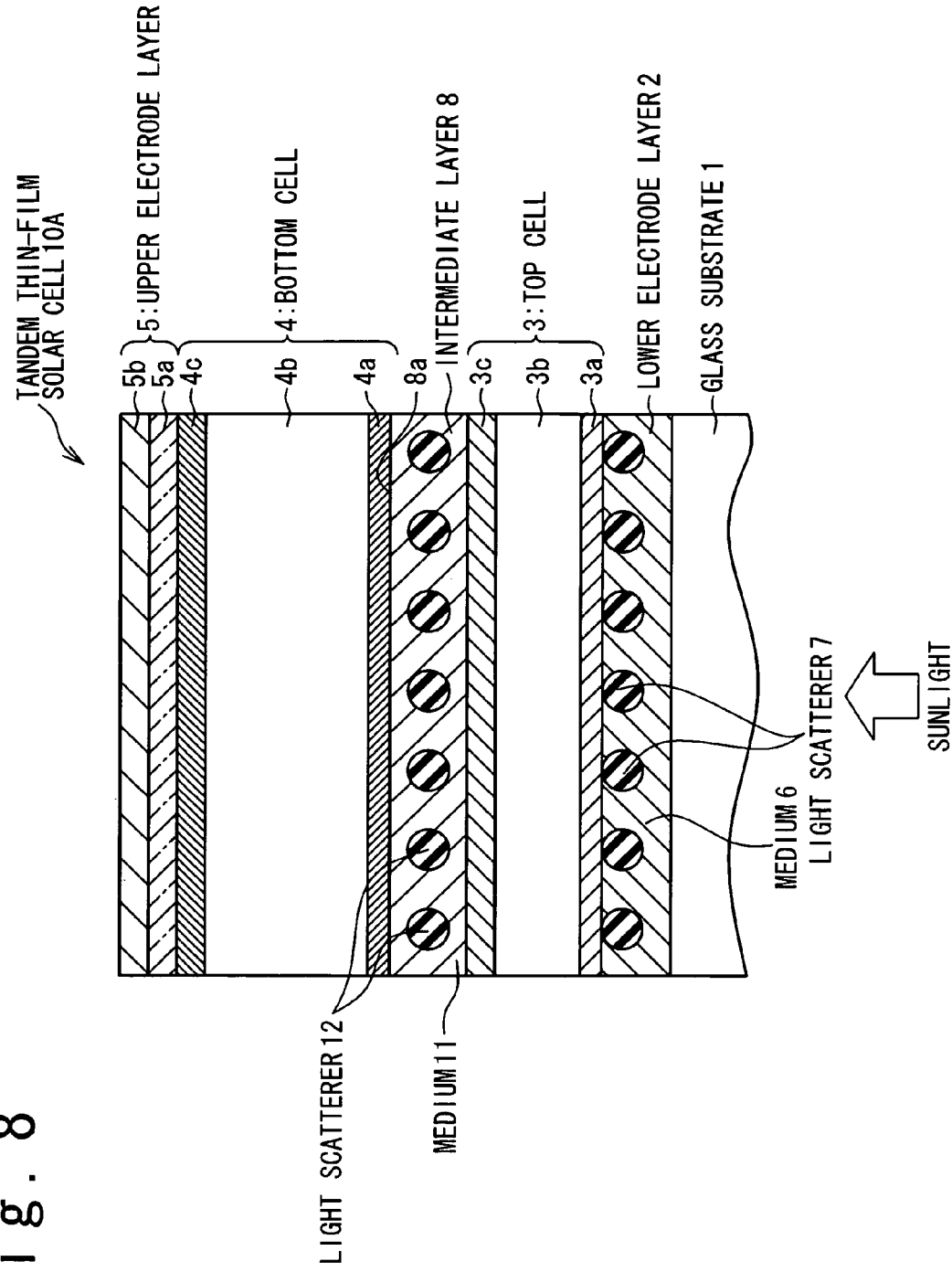
FIG. 8 is a sectional view showing a configuration of the tandem thin-film solar cell in another embodiment of the photoelectric conversion device according to the present invention.

In the case where an intermediate layer is provided between the top cell 3 and the bottom cell 4, the light-scattering film of the present invention is preferably used also for the intermediate layer. FIG. 8 is a sectional view showing a configuration of such a tandem thin-film solar cell 10A. The tandem thin-film solar cell 10A has an intermediate layer 8 provided between the top cell 3 and the bottom cell 4. A surface 8a of the intermediate layer 8 on the side of the bottom cell 4, is formed "substantially flat", and is formed by a medium 11 in which the intermediate layer 8 is formed by the conductive material, and a light scatterer 12 embedded in the medium 11. By embedding the light scatterer 12 in the intermediate layer 8, a transmitted light directed from the intermediate layer 8 toward the bottom cell 4, is sufficiently scattered, and a transmitted-light light-path length inside the bottom cell 4 is sufficiently increased. As a result, an absorbed light amount of the bottom cell 4 is increased. In addition, by embedding the light scatter 12 in the medium 11, the intermediate layer 8 does not need to be provided with the concavities and convexities for the purpose of the improvement in the conversion efficiency, and the surface 8a of the intermediate layer 8 on the side of the bottom cell 4, can be formed "substantially flat". The expression "substantially flat" used here, means the same as the definition given above. It is important to form the surface 8a of the intermediate layer 8 "substantially flat", in order to improve the conversion efficiency of the bottom cell 4. By forming the surface 8a of the intermediate layer 8 substantially flat, the generation of the defects in the p-type microcrystalline silicon layer 4a, the i-type microcrystalline silicon layer 4b, and the n-type microcrystalline silicon layer 4c, formed in order on the surface 8a, is suppressed, and the conversion efficiency of the bottom cell 4 is effectively improved.

Preferable physical properties of the medium 11 and the light scatterer 12 in the intermediate layer 8 are the same as those of the medium 6 and the light scatterer 7 in the lower electrode layer 2. For the medium 11, the general material widely used as the transparent electrode, as exemplified by tin oxide, zinc oxide, indium oxide, and ITO (Indium Tin Oxide), may be used. For the light scatterer 12, a material having a relative refractive index different from that of the medium 11, which specifically is titanium oxide, diamond, $SiO_2$ (glass), $MgF_2$, MgO, ZnO, $LiTaO_3$, and so on, may be preferably used. For the light scatterer 12, the conductive material does not need to be used.

Figure 9:
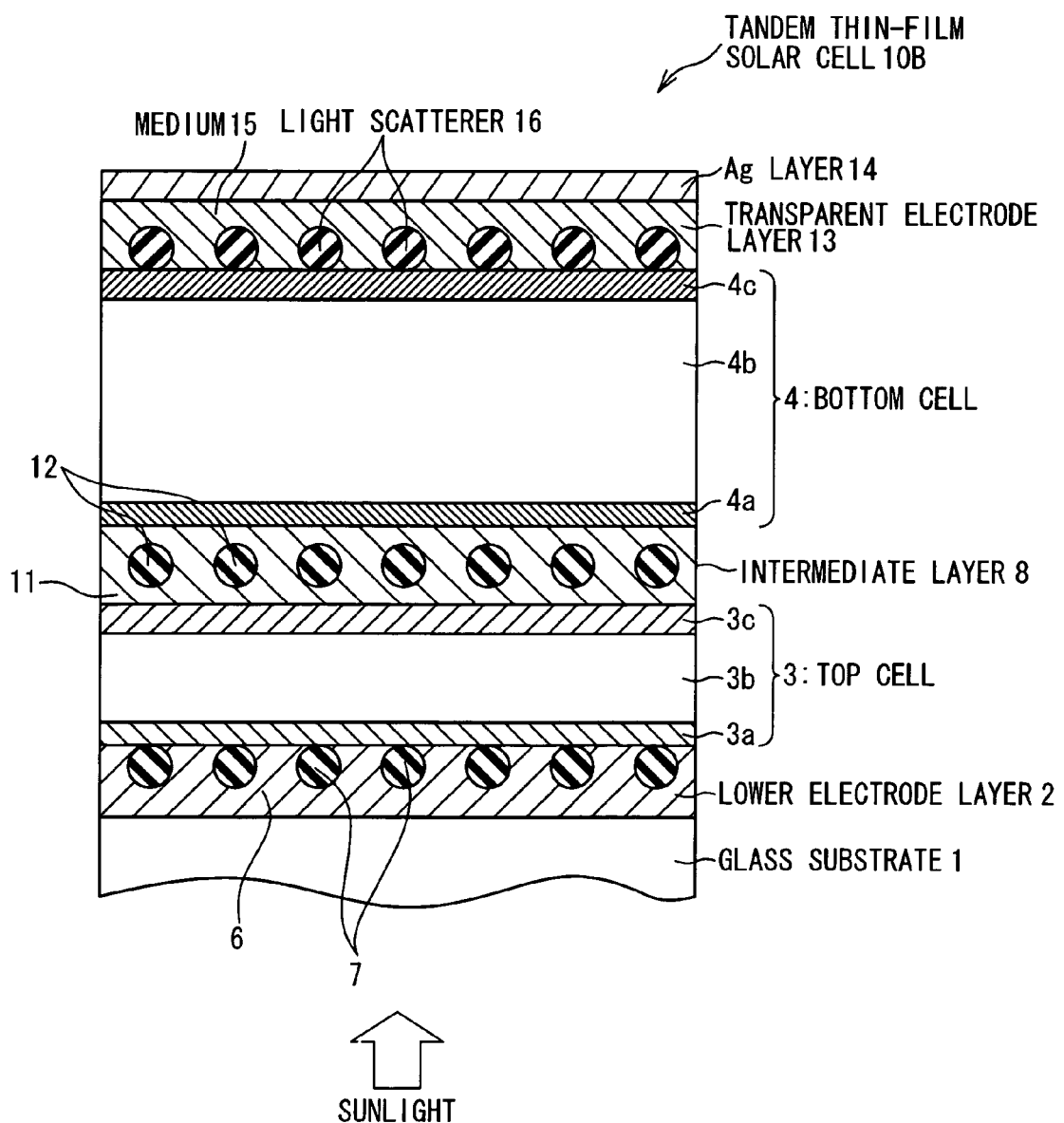
FIG. 9 is a sectional view showing a configuration of a tandem thin-film solar cell in another embodiment of the photoelectric conversion device according to the present invention.

It is also preferable that the light-scattering film mentioned above is used for an upper electrode layer. FIG. 9 is a sectional view showing a configuration of such a tandem thin-film solar cell 10B. The tandem thin-film solar cell 10B is provided with a transparent electrode layer 13 formed on the bottom cell 4, and a Ag layer 14 formed on the transparent electrode layer 13, instead of the upper electrode layer 5 in FIG. 3. The transparent electrode layer 13 and the Ag layer 14 function as an upper electrode of the tandem thin-film solar cell 10B. The transparent electrode layer 13 is formed by a medium 15, and a light scatterer 16 embedded in the medium 15.

Preferable physical properties of the medium 15 and the light scatterer 16 in the transparent electrode layer 13 are the same as those of the medium 6 and the light scatterer 7 in the lower electrode layer 2. For the medium 15, the conventional material widely used as the transparent electrode, as exemplified by tin oxide, zinc oxide, indium oxide, and ITO (Indium Tin Oxide), may be used. For the light scatterer 16, the material having a relative refractive index different from that of the medium 15, which specifically is titanium oxide, diamond, $SiO_2$ (glass), $MgF_2$, MgO, ZnO, $LiTaO_3$, and so on, is preferably used. For the light scatterer 16, the conductive material does not need to be used.

Figure 10:
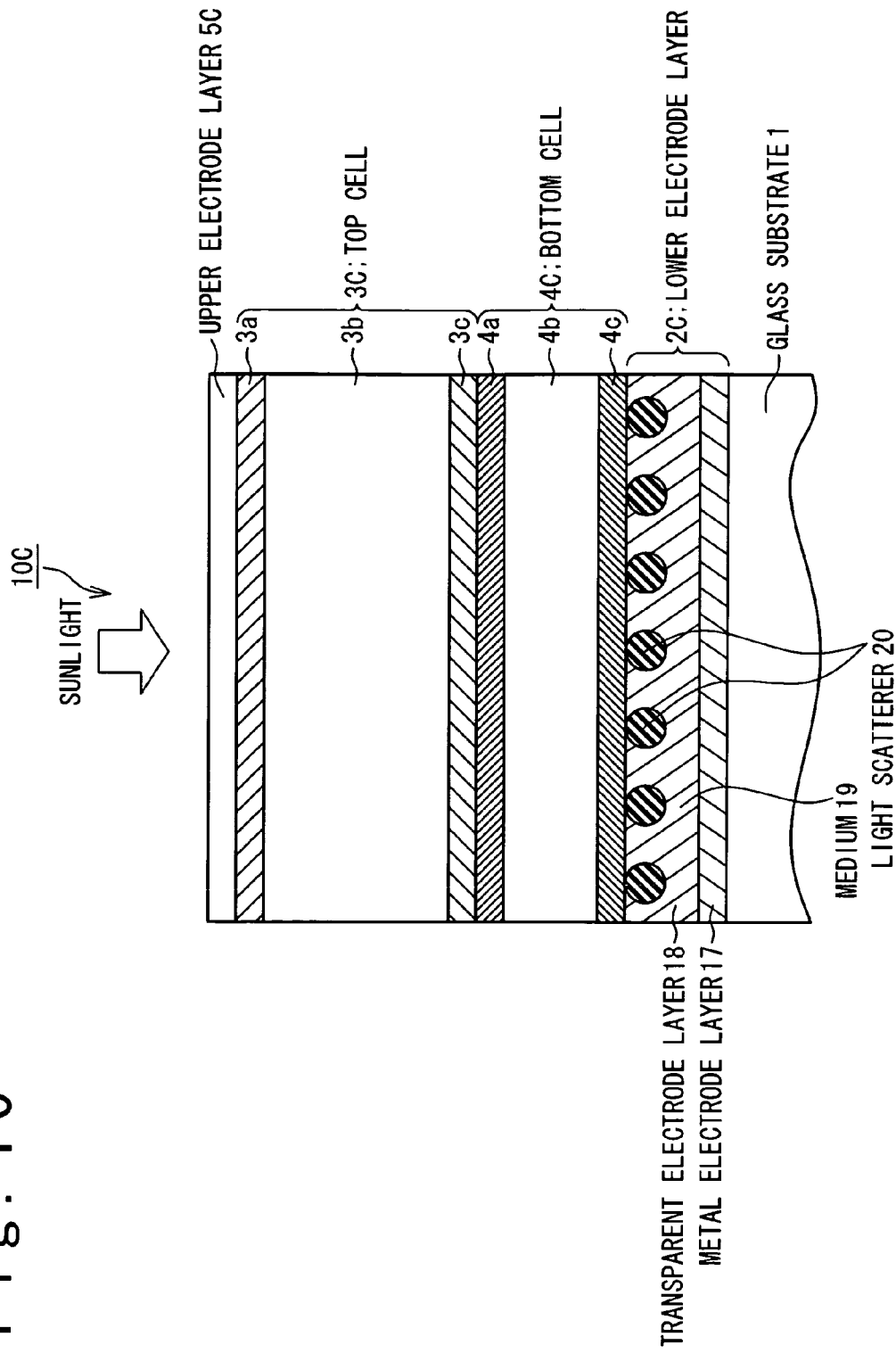
FIG. 10 is a sectional view showing a configuration of a tandem thin-film solar cell in another embodiment of the photoelectric conversion device according to the present invention.

The present invention is also applicable to a thin-film solar cell having a configuration in which the incident sunlight enters from a direction of an upper electrode. FIG. 10 is a sectional view showing a configuration of a tandem thin-film solar cell 10C having such a configuration. The tandem thin-film solar cell 10C is provided with a glass substrate 1, a lower electrode layer 2C, a bottom cell 4C, a top cell 3C, and an upper electrode layer 5C. The bottom cell 4C is formed by a p-type microcrystalline silicon layer 4a, an i-type microcrystalline silicon layer 4b, and an n-type microcrystalline silicon layer 4c, which are formed in order on the lower electrode layer 2C. The top cell 3C is formed by a p-type amorphous silicon layer 3a, an i-type amorphous silicon layer 3b, and an n-type amorphous silicon layer 3c, which are formed in order on the bottom cell 4C. The upper electrode layer 5C is formed by the conventional material widely used as the transparent electrode, as exemplified by tin oxide, zinc oxide, indium oxide, and ITO (Indium Tin Oxide).

The lower electrode layer 2C of the tandem thin-film solar cell 10C is formed by a metal electrode layer 17, and a transparent electrode layer 18 formed on the metal electrode layer 17. Similar to the tandem thin-film solar cell 10 in FIG. 3, the transparent electrode layer 18 is not deliberately provided with the concavities and convexities. Instead, the transparent electrode layer 18 is formed by a medium 19 made of a transparent conductive material, and a light scatterer 20 embedded in the medium 19. The light scatterer 20 scatters the incident light incident through the upper electrode layer 5C, and prompts the light absorption of the top cell 3 and the bottom cell 4. With such a configuration too, the conversion efficiency can be improved while suppressing the generation of the defects in the semiconductor layer forming the top cell 3C and the bottom cell 4C.

An intermediate layer may be provided also to the tandem thin-film solar cell 10C in FIG. 10. In this case, as is similar to the tandem thin-film solar cell 10A in FIG. 8, the intermediate layer is preferably formed by a medium and a light scatterer. Further, the upper electrode layer 5C is preferably formed by a medium and a light scatterer.

The present invention is also applicable to thin-film solar cells having various types of configurations different from the configuration mentioned above. For example, the configuration of the lower electrode layer 2 formed by the medium 6 and the light scatterer 7, and the configuration of the upper electrode layer containing the transparent electrode layer 13 formed by the medium 15 and the light scatterer 16, can be applied to a thin-film solar cell to which a photoelectric conversion cell is not laminated (namely, the cell that is not the tandem thin-film solar cell).

Also, the material other than silicon, as exemplified by SiC and SiGe, may be used for the material forming the thin-film solar cell.

Second Embodiment

Figure 11:
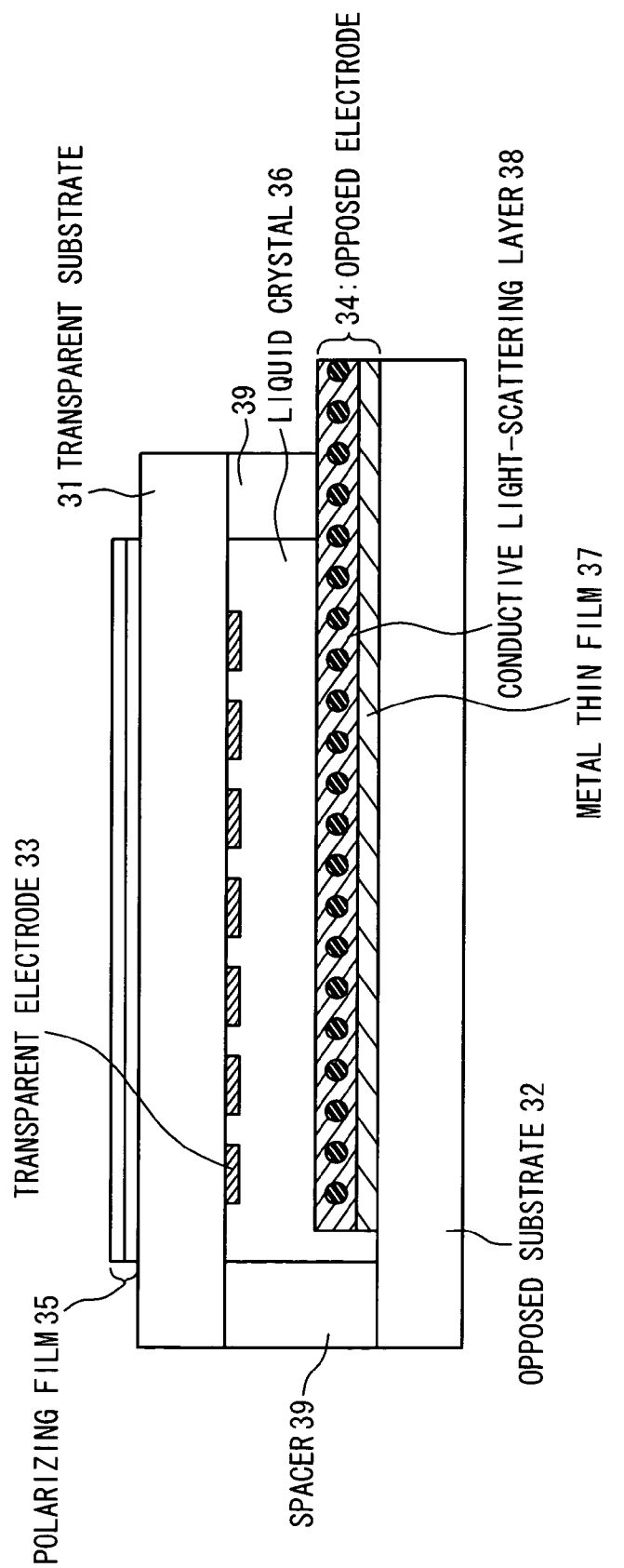
FIG. 11 is a sectional view showing a configuration of an embodiment of a liquid crystal display device according to the present invention.

In the second embodiment, a light-scattering layer of the present invention is used as an electrode of a reflective liquid crystal display device, as shown in FIG. 11. In the reflective liquid crystal display device, it is required that outside light incident to the reflective liquid crystal display device is reflected, and further, scattered. The light-scattering film of the present invention is used as the electrode for applying a desired voltage to a liquid crystal, and as a light-scattering means to scatter the light.

More specifically, the reflective liquid crystal display device of the second embodiment is provided with a transparent substrate 31, an opposed substrate 32, a transparent electrode 33, an opposed electrode 34, and a polarizing film 35. The transparent substrate 31 and the opposed substrate 32 are supported to face to each other by a spacer 39, and a liquid crystal 36 is filled between the transparent substrate 31 and the opposed substrate 32. The transparent electrode 33 and the opposed electrode 34 are used to apply the voltage that corresponds to a pixel tone, to the liquid crystal 36. The transparent electrode 33 is joined to the transparent substrate 31, and the opposed electrode 34 is joined to the opposed substrate 32. The polarizing film 35 is joined to an opposite surface to the surface to which the transparent electrode 33 is joined, and selectively transmits only linear polarized light.

Figure 1:
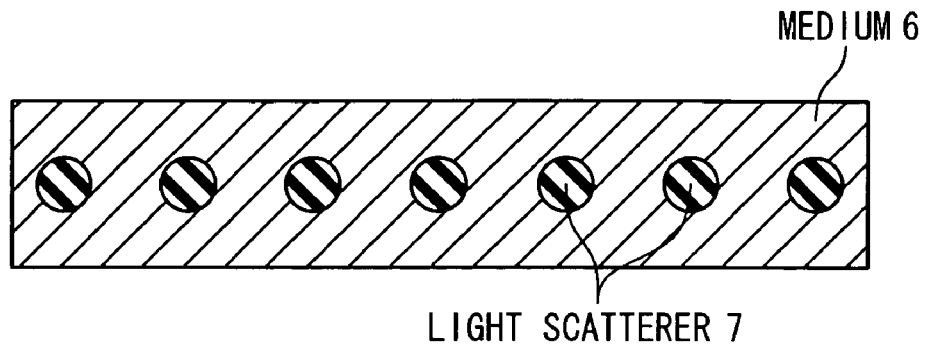
FIG. 1 is a sectional view showing an embodiment of a light-scattering layer according to the present invention.

In order to reflect and scatter incident light incident to the reflective liquid crystal display device, the opposed electrode 34 is formed by a metal thin film 37 and a conductive light-scattering layer 38. The metal thin film 37 is joined to the opposed substrate 32, and the conductive light-scattering layer 38 is formed on the metal thin film 37. For the conductive light-scattering layer 38, the light-scattering film of the present invention as shown in FIG. 1 is used. On the other hand, the conductive light-scattering layer 38 is formed by a transparent and conductive medium, and a light scatterer embedded in the medium. The opposed electrode 34 having such configuration applies the voltage that corresponds to the pixel tone to the liquid crystal 36, and reflects the incident light with the metal thin film 37, and scatters the light reflected by the conductive light-scattering layer 38. The opposed electrode 34 having such configuration is effective to simplify the configuration of the reflective liquid crystal display device.

It should be noted in the reflective liquid crystal display device of the second embodiment, that undesired concavities and convexities do not need to be provided to the opposed electrode 34. Provision of the concavities and convexities to the opposed electrode 34 is not preferable, since the concavities and convexities may have an adverse impact to an orientation of the liquid crystal 36. It is possible to scatter the light without providing the undesired concavities and convexities to the opposed electrode 34, by incorporating the light-scattering layer of the present invention to the opposed electrode 34.

As demonstrated by a simulation described later, the conductive light-scattering layer 38 can increase a reflection ratio by adjusting a size of the light scatterer contained in conductive light-scattering layer 38. In this case, it is possible that the metal thin film 37 is not used.

Third Embodiment

Figure 12:
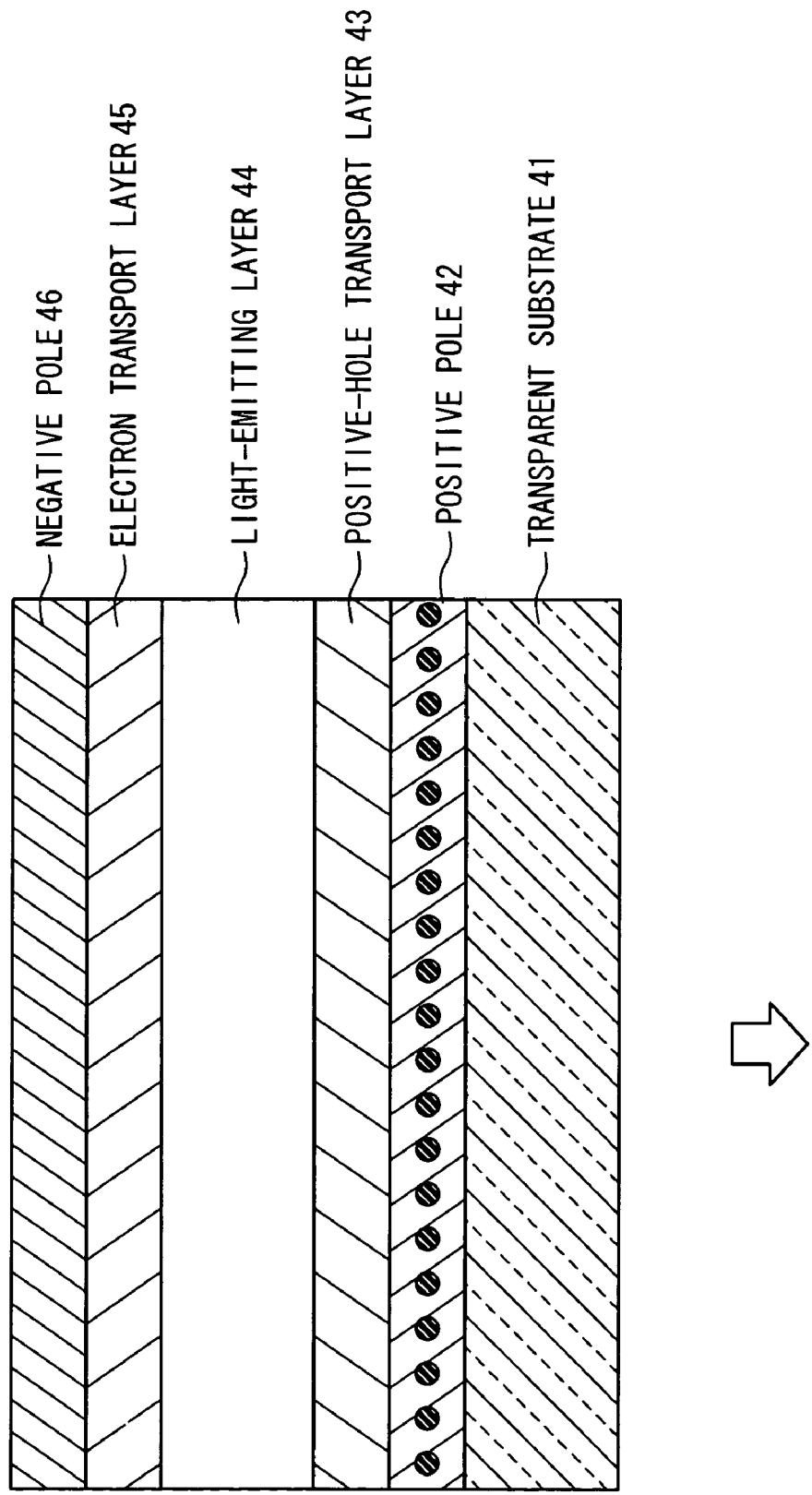
FIG. 12 is a sectional view showing a configuration of an embodiment of a light-emitting device according to the present invention.

In the third embodiment, a light-scattering layer of the present invention is used as an electrode of an organic EL (electroluminescence) element, as shown in FIG. 12. In the organic EL element, scattering of light generated by the organic EL element is useful in some cases. For example, when the organic EL element is used for a display device, the scattering of the generated light is useful for improving visibility of the display device. In this embodiment, the light-scattering layer of the present invention supplies an electric current to a light-emitting layer, and is further used to scatter the light.

More specifically, the organic EL element of the third embodiment is provided with a transparent substrate 41, a positive pole 42, a positive-hole transport layer 43, a light-emitting layer 44, an electron transport layer 45, and a negative pole 46. In the organic EL element, the positive holes are injected from the positive pole 42 to the light-emitting layer 44 through the positive-hole transport layer 43, and the electrons are injected from the negative pole 46 to the light-emitting layer 44 through the electron transport layer 45. Light is generated by the recombination of the positive holes and electrons in the light-emitting layer 44.

For the positive pole 42, the light-scattering layer of the present invention as shown in FIG. 1, is used. That is, the positive pole 42 is formed by transparent and conductive medium, and a light scatterer embedded in the medium. Such configuration of the positive pole 42 makes it possible to realize both functions of supplying the positive holes to the light-emitting layer 44 and of scattering the light, with a simple configuration.

Additionally, it is obvious for those skilled in the art, that the configuration of the organic EL element can be changed appropriately. For example, the light-scattering layer of the present invention can be used as the negative pole 46. Also, the light-emitting layer 44 can be directly connected to the positive pole 42 without involving the positive-hole transport layer 43, and to the negative pole 46 without involving the electron transport layer 45.

The usefulness of the light-scattering layer of the present invention is demonstrated below by using simulation results.

Simulation Result 1

Figure 13:
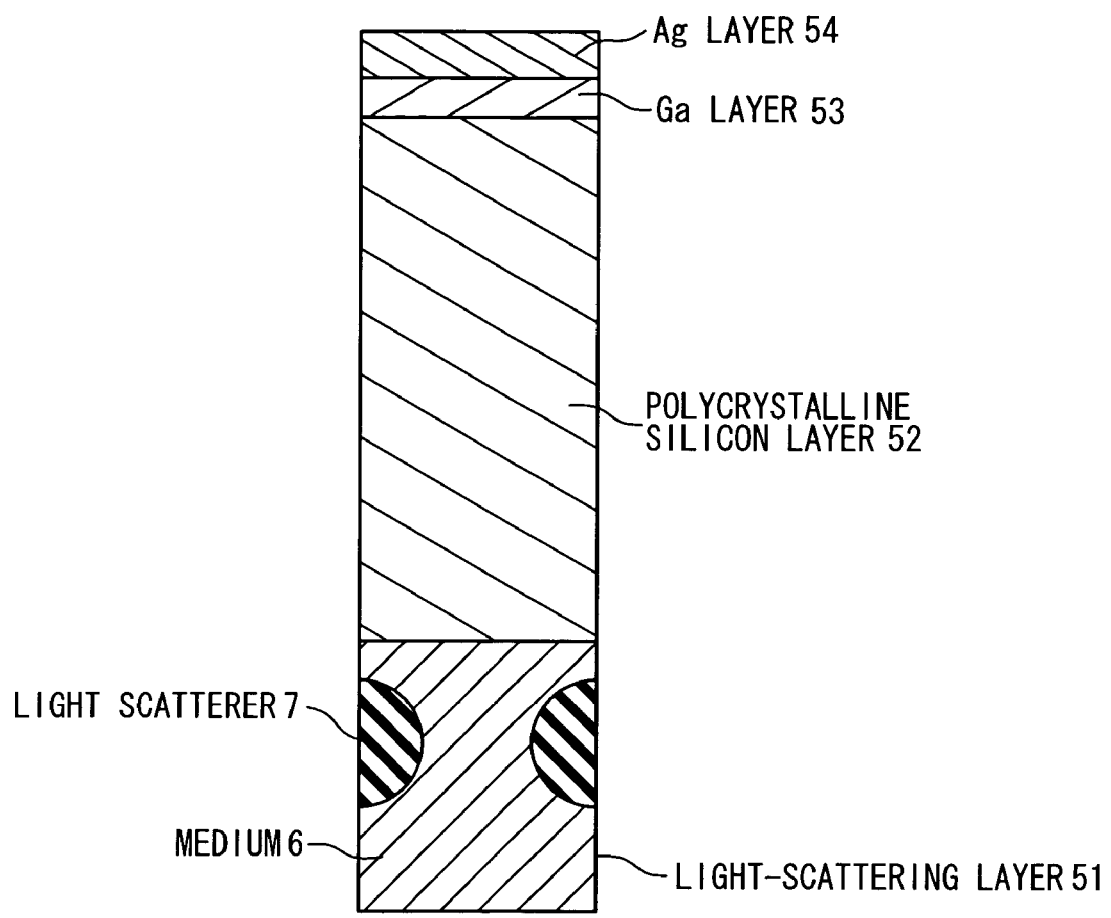
FIG. 13 is a sectional view showing a configuration of a simulation object.

A simulation was carried out on a structure shown in FIG. 13 for examining the usefulness of the light-scattering film of the present invention. In this structure, a polycrystalline silicon layer 52, a gallium-doped zinc oxide layer (ZnO:Ga layer), and a Ag layer 54, are formed in order on a light-scattering layer 51. Tin oxide to which fluorine is doped, is used for the medium 6 of the light-scattering layer 51, and a sphere formed by $TiO_2$ is used for the light scatterer 7. A thickness of the light-scattering layer 51 is selected from 0.7 μm and 1.2 μm, and a diameter of the light scatterer 7 is selected from a range of 60 to 1200 nm. Thickness of the polycrystalline silicon layer 52, the ZnO:Ga layer 53, and the Ag layer 54 is in a fixed point in a range of 1 to 3 μm, 20 to 200 nm, and 0.1 to 10 μm, respectively. In the simulation, a configuration shown in FIG. 13 is assumed to be infinitely repeated to an in-plane direction.

The simulation was carried out by solving Maxwell's equations of electromagnetism as they are, with the use of a finite difference time domain (FDTD). Details of calculating conditions in the FDTD analysis are as follows:

Incident light is a plane wave parallel to a surface of the light-scattering layer 51. A Berenger's Perfect Matching Layer method (see J. P. Berenger, J. Computational Physics, 114, 185 (1994)) was applied to an algorithm of an absorption boundary. Amplitude of a reflected wave and a time change in the amplitude of an electromagnetic wave in each cell are recorded with respect to an entire calculation time, and the amplitude of 300 nm to 1200 nm (a wavelength in the air or in the vacuum) was represented at intervals of 5 nm by Fourier transform. Calculation convergence of an absorption ratio of silicon was confirmed by the fact that a sum of the absorption ratio and the reflection ratio becomes 100%. From this calculation, a quantum efficiency spectrum of the polycrystalline silicon layer 52 was determined. Further, in a wavelength range of 300 nm to 1200 nm (a wavelength in the air or in the vacuum), the product of photon number density of reference sunlight (mentioned in JIS C8911 for example), and the quantum efficiency spectrum in each cell, was integrated with respect to the wavelength, and short-circuit current density $J_{SC}$ was calculated from total absorbed photon number density by using the following formula:

$$J_{SC} = \int d\lambda G(\lambda) \eta(\lambda)/Q. \quad (1)$$

Here, $\int d\lambda$ shows an integral in a wavelength range of 300 nm to 1200 nm; $G(\lambda)$ is a spectrum of the reference sunlight (mentioned in JIS8911C); $\eta(\lambda)$ is a quantum efficiency; and Q is an electrical charge of an electron. The short-circuit current density $J_{SC}$ given by the formula (1) is electric current density of an electric current caused by a pair of positive holes and negative holes generated from absorbed light, equivalent to a degree of light absorption. Therefore, the term may also be referred to as equivalent electric current density $J_{SC}$ in description below.

Further, a layer thickness d was calculated from the equivalent electric current density $J_{SC}$. The equivalent layer thickness is an indicator showing an increase in the light absorption attained by the light scattering in the light-scattering layer 51; by the light scattering of the light-scattering layer 51, a light-path length is increased to increase the light absorption. This is equivalent to the increase in the layer thickness of the polycrystalline silicon layer 52. That is, the equivalent layer thickness shows the increase in the light-path length caused by the light scattering, by using an equivalent layer thickness of the polycrystalline silicon layer 52.

The equivalent layer thickness d was calculated by using the relationship shown by the following formula (2):

$$J_{SC} = \int d\lambda G(\lambda)\{1-\exp(-\alpha(\lambda)d)\}/Q, \quad (2)$$

Here, $\alpha(\lambda)$ is an absorption coefficient of a single crystal Si. It should be noted that the formula (2) is obtained from the formula (1) and the following formula (3):

$$\int d\lambda G(\lambda)\{1-\exp(-\alpha(\lambda)d)\} = \int d\lambda G(\lambda)\eta(\lambda), \quad (3)$$

Figure 14:
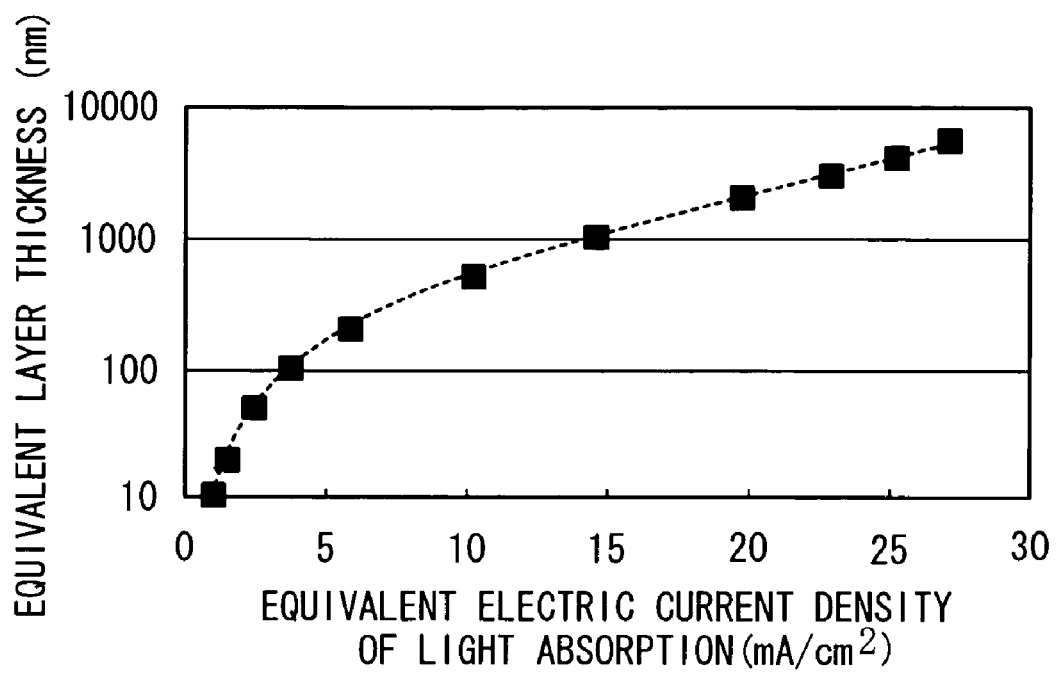
FIG. 14 is a graph showing the relationship between equivalent electric current density and equivalent layer thickness.

The relationship between the equivalent electric current density $J_{SC}$ obtained from the formula (2), and the equivalent layer thickness d, is shown in FIG. 14.

The equivalent layer thickness d was normalized by the original layer thickness of the polycrystalline silicon layer 52 (that is, a fixed point in a range of 1 to 3 μm, which is the film thickness of the polycrystalline silicon layer 52 mentioned in [0070]), and was calculated as an equivalent layer thickness ratio. The equivalent layer thickness ratio was adopted as an indicator showing a degree of the scattering of the light-scattering layer 51. If the equivalent layer thickness ratio exceeds 100%, the presence of a light-scattering property toward the polycrystalline silicon layer 52 is indicated.

Figure 15A:
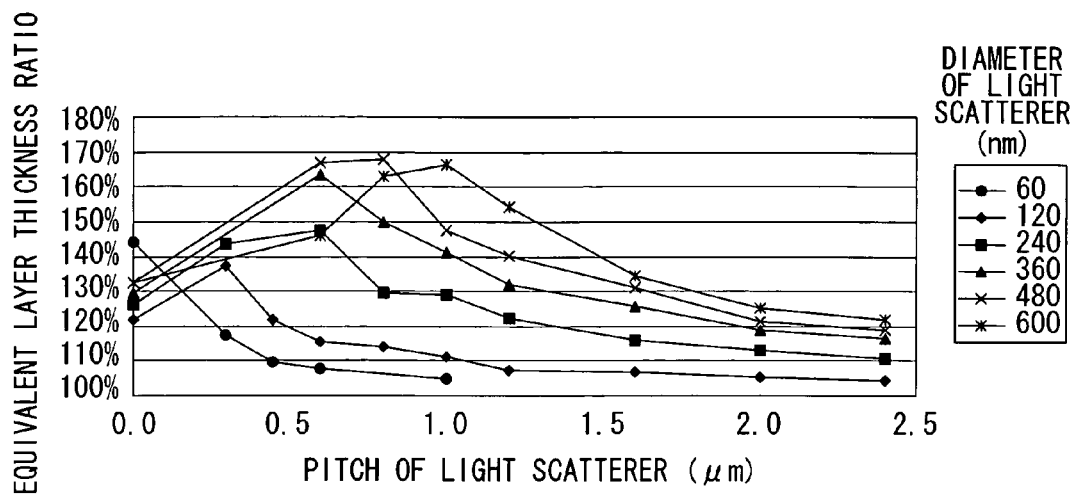
FIG. 15A is a graph showing the relationship between a pitch of a light scatterer and an equivalent layer thickness ratio when the light scatterer is made of $TiO_2$ and a diameter thereof is in a range of 60 nm to 600 nm.
Figure 15B:
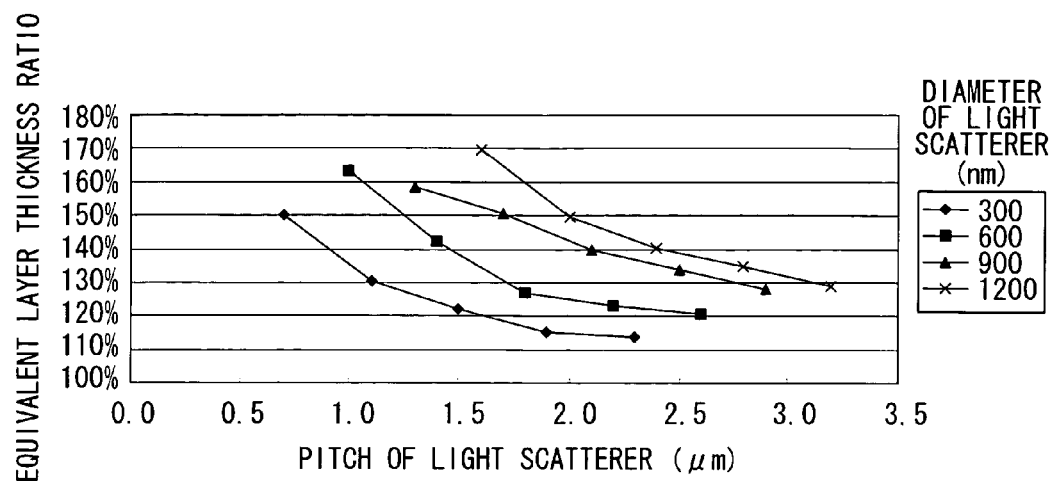
FIG. 15B is a graph showing the relationship between the pitch of the light scatterer and the equivalent layer thickness ratio when the light scatterer is made of $TiO_2$ and the diameter thereof is in a range of 300 nm to 1200 nm.

FIG. 15A is a graph showing the relationship between a pitch of the light scatterer 7 and the equivalent layer thickness ratio, when the diameter of the light scatterer 7 is in a range of 60 nm to 600 nm. FIG. 15B is a graph showing the relationship between the pitch of the light scatterer 7 and the equivalent layer thickness ratio, when the diameter of the light scatterer 7 is in a range of 300 nm to 1200 nm. The thickness of the light-scattering layer 51 is assumed to be 0.7 μm in the case of FIG. 15A, and is assumed to be 1.2 μm in the case of FIG. 15B. However, it should be noted in the both graphs of FIGS. 15A and 15B, that a value of the equivalent layer thickness ratio at a pitch value of "0 nm", is a value in the case of a configuration in which continuous $TiO_2$ layers having a layer thickness equal to the diameter of the light scatterer 7, are provided between the medium 6 and the polycrystalline silicon layer 52, instead of the light scatterer 7, and that the light scatterer 7 is in contact with the interface between the light scatterer 51 and the polycrystalline silicon layer 52.

As is understood from FIGS. 15A and 15B, the equivalent layer thickness ratio exceeding 100% can be obtained, by setting the diameter of the light scatterer 7 to a range of 60 nm to 1200 nm, and by further setting the pitch of the light scatterer 7 equal to or below two times 1200 nm, 1200 nm being the high value of the light wavelength region used for power generation, namely, to 2400 nm or below. This means that setting of the diameter and the pitch of the light scatterer 7 to the above mentioned ranges is advantageous to improve scattering efficiency of the sunlight.

Figure 16:
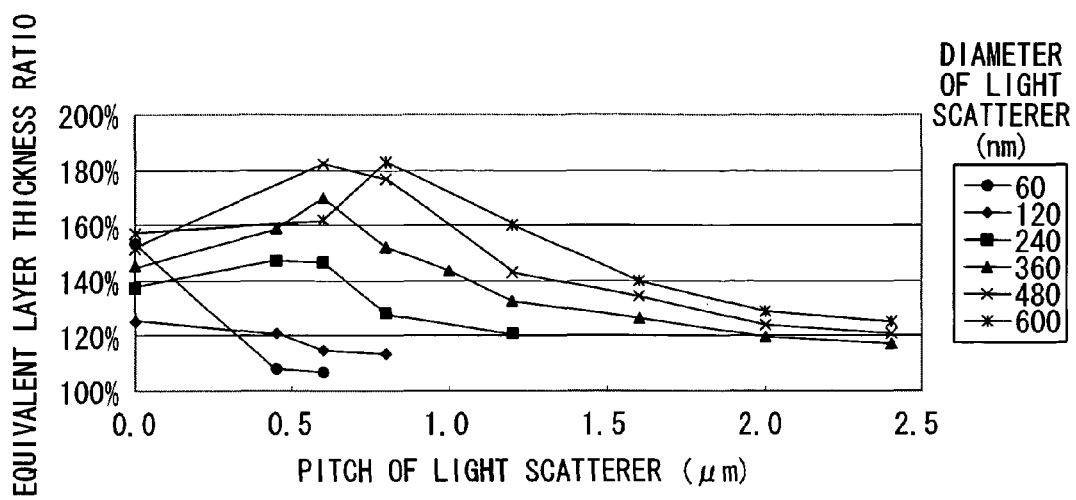
FIG. 16 is a graph showing the relationship between the pitch of the light scatterer and the equivalent layer thickness ratio when the light scatterer is made of diamond and the diameter thereof is in a range of 60 nm to 600 nm.

The same applies to the case where the light scatterer 7 is formed by diamond. FIG. 16 is a graph showing the relationship between the pitch and the diameter of the light scatterer 7, and the equivalent layer thickness ratio, in the case where the film thickness of the lower electrode layer 2 is assumed to be 0.7 μm, and diamond is used as the light scatterer 7. More in detail, FIG. 16 is a graph showing the relationship between the pitch of the light scatterer 7 and the equivalent layer thickness ratio, in the case where the light scatterer 7 is in contact with the interface between the light scatterer 51 and the polycrystalline silicon layer 52, and the diameter of the light scatterer 7 is in a range of 60 nm to 600 nm. As is understood from FIG. 16, the behavior of the equivalent layer thickness ratio when the light scatterer 7 is formed by diamond, is approximately the same as that of the equivalent layer thickness ratio when the light scatterer 7 is formed by $TiO_2$. This indicates that diamond may be selected as the material of the light scatterer 7.

Figure 17:
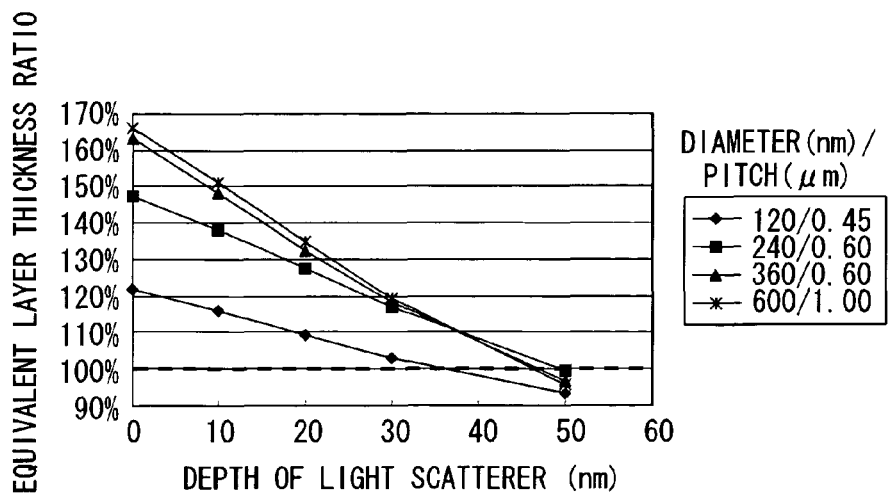
FIG. 17 is a graph showing the relationship between a depth of the light scatterer and the equivalent layer thickness ratio.

FIG. 17 shows the relationship between a distance from the surface of the light-scattering layer 51 on the side of the polycrystalline silicon layer 52 to the light scatterer 7 (namely, a depth of the light scatterer 7), and the equivalent layer thickness ratio. The diameter of the light scatterer 7 is selected among 120 nm, 240 nm, 360 nm, and 600 nm, and the pitch is selected such that the equivalent layer thickness ratio is maximized with respect to each diameter.

As is understood from FIG. 17, the shorter the depth of the light scatterer 7 is, the higher equivalent layer thickness ratio can be obtained. More specifically, the equivalent layer thickness ratio that exceeds 100% can be obtained by setting the depth of the light scatterer 7 to 30 nm or below. FIG. 17 shows the effectiveness of setting the depth of the light scatterer 7 to 50 nm or below, and preferably to 30 nm or below.

Simulation Result 2

A simulation on reflection of the light by the light-scattering layer was further carried out. In the simulation, the reflection of the light by the light-scattering layer was assessed with the use of an integrated Reflection Haze ratio $H_z$. The integrated Reflection Haze ratio $H_z$ is a value showing a ratio of the light reflected to directions other than a vertical direction, to the light reflected by the light-scattering layer, as defined by the following formula (4) by using a reflection ratio spectrum with respect to all the directions $r_{total}(\lambda)$, and a reflection ratio spectrum with respect to the vertical direction $r_{normal}(\lambda)$.

$$H_z = 1 - R_{normal}/R_{total},$$

$$R_{total} = \int d\lambda G(\lambda) \cdot r_{total}(r)/Q,$$

$$R_{normal} = \int d\lambda G(\lambda) \cdot r_{normal}(r)/Q. \quad (4)$$

It should not be noted that the integrated Reflection Haze ratio $H_z$ as defined by the forgoing, can be considered in comparison with a Transmission Haze ratio widely used in general. The Transmission Haze ratio $Hz_t(\lambda)$ is a value defined by the following formula (5) by using a transmission ratio with respect to all the directions $t_{total}(\lambda)$, and a transmission ratio with respect to directions other than the vertical direction $t_{slant}(\lambda)$:

$$Hz_t(\lambda) = t_{slant}(\lambda)/t_{total}(\lambda) \quad (5)$$

The integrated Reflection Haze ratio $H_z$ mentioned above is an index defined by applying the same concept as the Transmission Haze ratio to the reflection.

Figure 18:
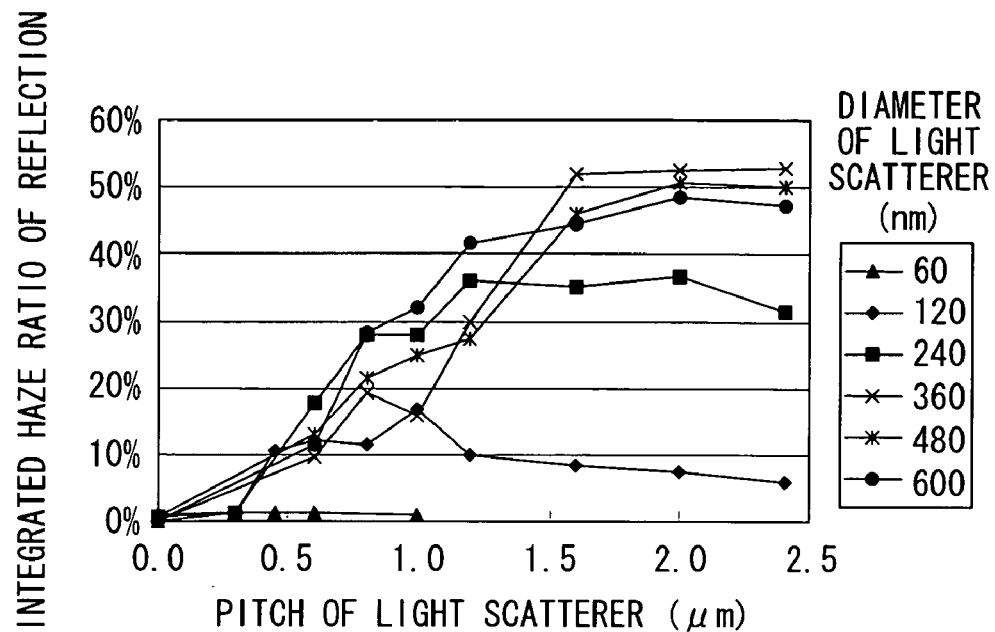
FIG. 18 is a graph showing the relationship between the diameter and the pitch of the light scatterer and an integrated reflection Haze ratio.

FIG. 18 is a graph showing the relationship between the pitch and the diameter of the light scatterer 7, and the Reflection Haze ratio. The light scatterer 7 is assumed to be a sphere formed by $TiO_2$. It should be noted that a value of the transmission Haze ratio at the light-scatter pitch value of "0 nm", is a value of the equivalent layer thickness ratio in the case of a configuration in which continuous $TiO_2$ layers, instead of the light scatterer 7, having a layer thickness equal to the dimater of the light scatterer 7 is provided between the medium 6 and the polycrystalline silicon layer 52.

As shown in FIG. 18, the integrated reflection Haze ratio widely increases following the increase in the diameter and the pitch of the light scatterer 7. The result indicates that the light-scattering layer of the present invention is capable of any desired control of the scattering of the reflected light. Being capable of controlling the reflection of the light-scattering layer is especially important when the light-scattering layer is provided with a function of reflecting light as shown by the reflected liquid crystal display device in FIG. 1.

Simulation Result 3

As explained with reference to FIG. 2, it is preferable that the light scatterer 7 is formed by a light scatterer made of two or more kinds of materials having a relative refractive index different from each other. The effectiveness of forming the light scatter 7 by the two or more kinds of materials having a relative refractive index different from each other, was demonstrated by a simulation. The simulation was carried out on the assumption that a light-scattering layer in which a $TiO_2$ sphere and a glass sphere are alternately arranged as the light scatterer 7, is used instead of the light-scattering layer 51 shown in FIG. 13. The pitch of the light scatterer 7 was 0.3 μm. The medium 6 forming the light-scattering layer was assumed to be formed by tin oxide to which fluorine was doped. The thickness of the light-scattering layer was assumed to be 0.7 μm.

Figure 19:
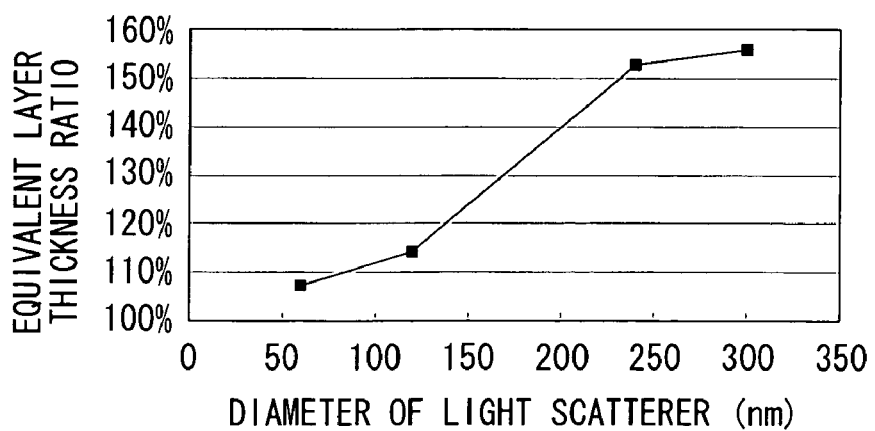
FIG. 19 is a graph showing the relationship between the diameter of the light scatterer and the equivalent layer thickness ratio, with regard to a light-scattering layer in which a $TiO_2$ sphere and a glass sphere are alternately arranged as the light scatterer.

FIG. 19 is a graph showing the relationship between the equivalent layer thickness ratio, and the diameter of the light scatterer 7, in the case of the light-scattering layer in which the $TiO_2$ sphere and the glass sphere are alternately arranged. As is understood from FIG. 19, large equivalent layer thickness ratio can be obtained by alternately arranging the $TiO_2$ sphere and the glass sphere. This shows the effectiveness of forming the light scatterer 7 by the two or more kinds of materials having a relative refractive index different from each other.

Simulation Result 4

Next, an advantage of using the light-scattering layer of the present invention in the tandem thin-film solar cell 10 having the configuration in FIG. 3 was examined by a simulation. A process of the simulation of the tandem thin-film solar cell 10 is generally the same as the simulation mentioned above, except for the difference of the configuration of the simulated object. The process of the simulation of the tandem thin-film solar cell 10 is described below more in detail.

The simulation of the tandem thin-film solar cell 10 was carried out by solving the Maxwell's equations of electromagnetism as they are, by using the finite difference time domain (FDTD). Details of calculating conditions of the FDTD analysis are as follows:
Incident light is a plane wave parallel to a surface of a substrate. That is, the substrate was assumed to be directed straight to the sun. The Berenger's Perfect Matching Layer method (see J. P. Berenger, J. Computational Physics, 114, 185 (1994)) was applied to an algorithm of an absorption boundary. Amplitude of a reflected wave and a time change in the amplitude of an electromagnetic wave in each cell are recorded with respect to an entire calculation time, and the amplitude of 300 nm to 1200 nm (a wavelength in the air or in the vacuum) was represented at intervals of 5 nm by the Fourier transform. Calculation convergence of an absorption ratio of silicon was confirmed by the fact that a sum of the absorption ratio and the reflection ratio becomes 100%. From this calculation, quantum efficiency spectra of the top cell 3 and the bottom cell 4 were obtained. Further, in a wavelength range of 300 nm to 1200 nm (a wavelength in the air or in the vacuum), the product of the photon number density of the reference sunlight (mentioned in JIS C8911 and so on), and the quantum efficiency spectrum in each cells was integrated with respect to the wavelength, and the short-circuit electric current density was considered to be equivalent to the total absorbed photon number density. The assumption is reasonable if applied to a practical solar cell with fewer defects inside a photoelectric conversion layer.

Figure 20:
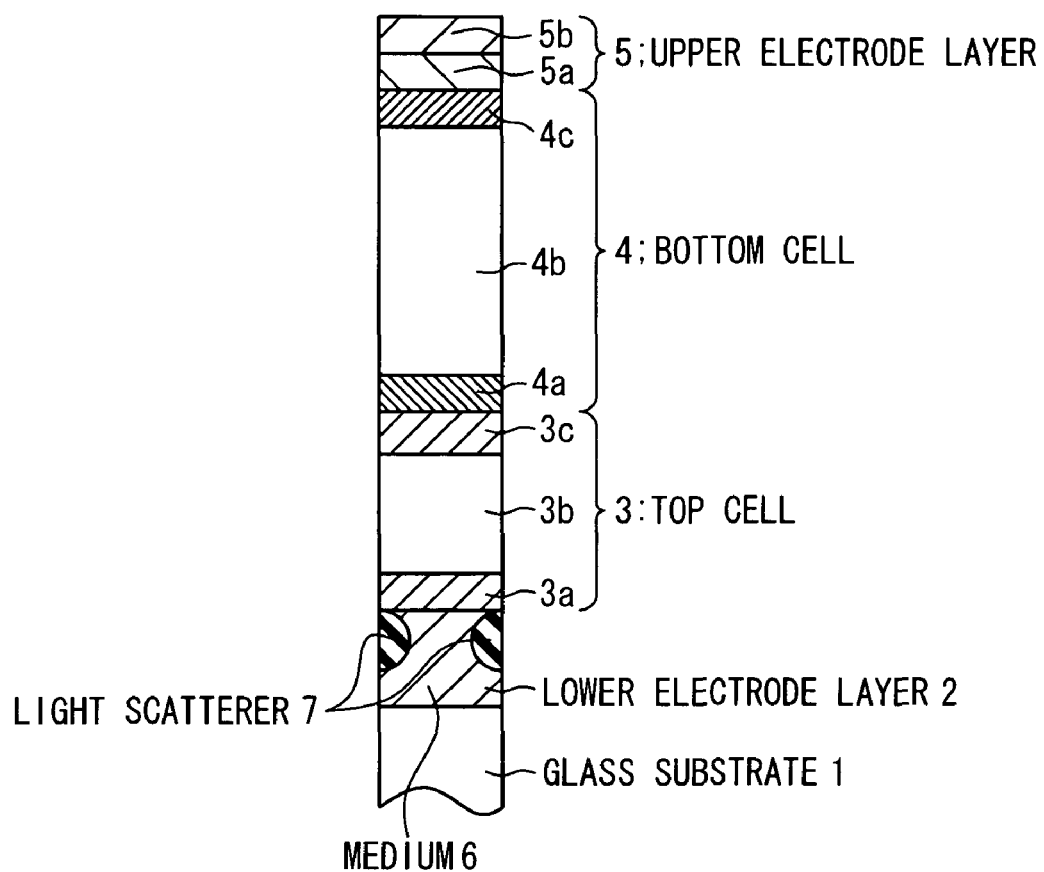
FIG. 20 is a sectional view showing a configuration of an object of a simulation on a property of the tandem thin-film solar cell.

FIG. 20 shows a cross-sectional configuration as the object of the simulation. In the simulation, each of the members of the light scatterers 7 is assumed to be a sphere having the same diameter. Therefore, the average diameter of the light scatterer 7 is equivalent to the diameter of any one member of the light scatterer 7. In addition, it is assumed that the configuration in FIG. 7 is infinitely repeated to an in-plane direction of the glass substrate 1. In other words, the average pitch of the light scatterer 7 is equivalent to pitch of any two members of the light scatterer 7 adjacent to each other. $SnO_2$ to which fluorine is doped, is assumed to be used for the medium 6 in the lower electrode layer 2. Further, the light scatterer 7 is assumed to be located to come in contact with the surface 2a of the lower electrode layer 2. (Here, the layer thickness of the top cell 3, the bottom cell 4, the ZnO layer 5a, and the Ag layer 5b are fixed to a point in ranges of 0.1 to 0.5 μm, 1 to 5 μm, 20 to 200 nm, and 0.1 to 10 μm, respectively.)

Additionally, a short-circuit current of the tandem thin-film solar cell 10 is normalized by the short-circuit currents of the top cell 3 and the bottom cell 4 in the tandem thin-film solar cell formed on a TCO (transparent conductive oxide) substrate that is flat, each being shown as a short-circuit current ratio (%). The short-circuit current ratio that exceeds 100% indicates the presence of the light-scattering property toward a photoelectric conversion layer. An argument with the use of the same index (the short-circuit current) is developed in the above mentioned document (see Yoshiyuki Nasuno et al., "Effects of Substrate Surface Morphology on Microcrystalline Silicon Solar Cells", Jpn. J. Appl. Phys., The Japan Society of Applied Physics, 1 Apr. 2001, vol 40, pp. L303-L305.), even for a transparent electrode formed on a texture (Asahi-U, which is a texture TCO substrate produced by Asahi Glass Co., Ltd.). Therefore, the short-circuit current is appropriate as the index of a light-scattering performance.

Figure 21A:
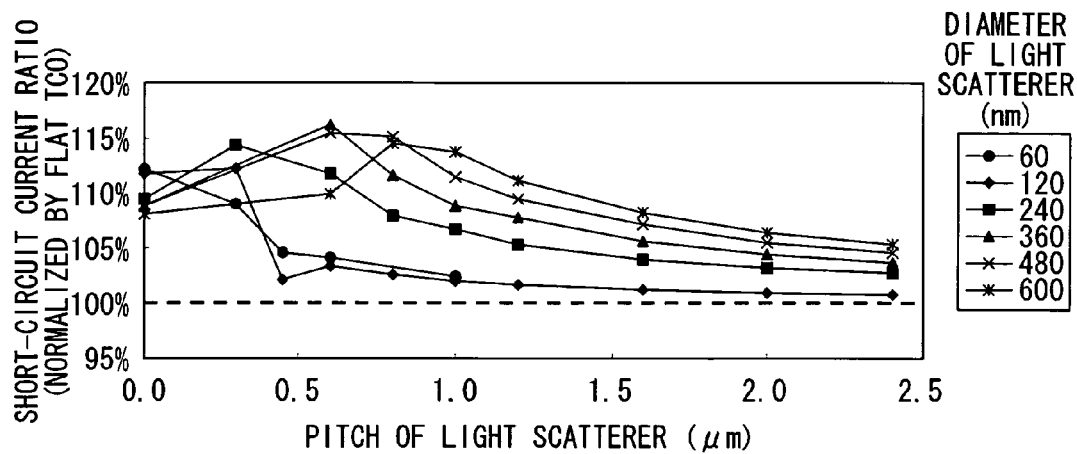
FIG. 21A is a graph showing the relationship between the pitch of the light scatterer and a short-circuit current ratio of a top cell, when the light scatterer is made of $TiO_2$ and the diameter thereof is in a range of 60 nm to 600 nm.
Figure 21B:
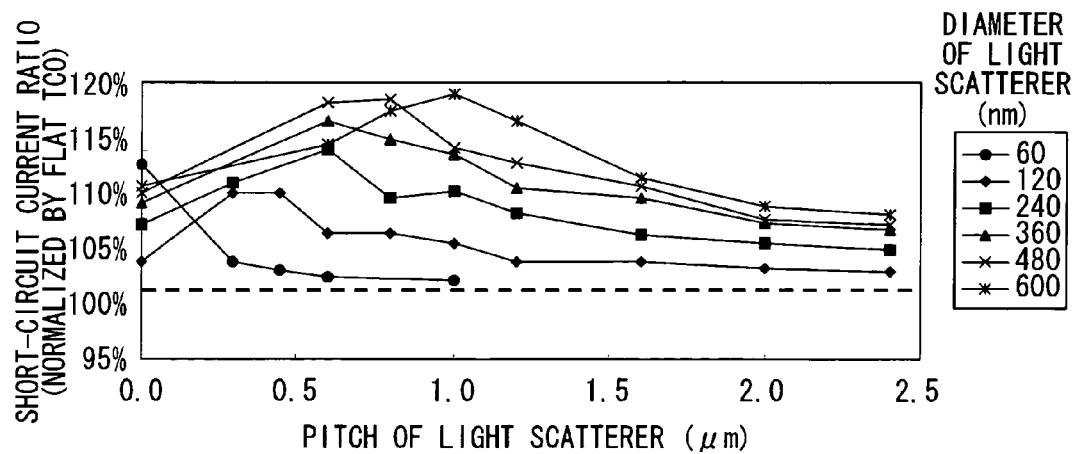
FIG. 21B is a graph showing the relationship between the pitch of the light scatterer and a short-circuit current ratio of a bottom cell, when the light scatterer is made of $TiO_2$ and the diameter thereof is in a range of 60 nm to 600 nm.
Figure 22A:
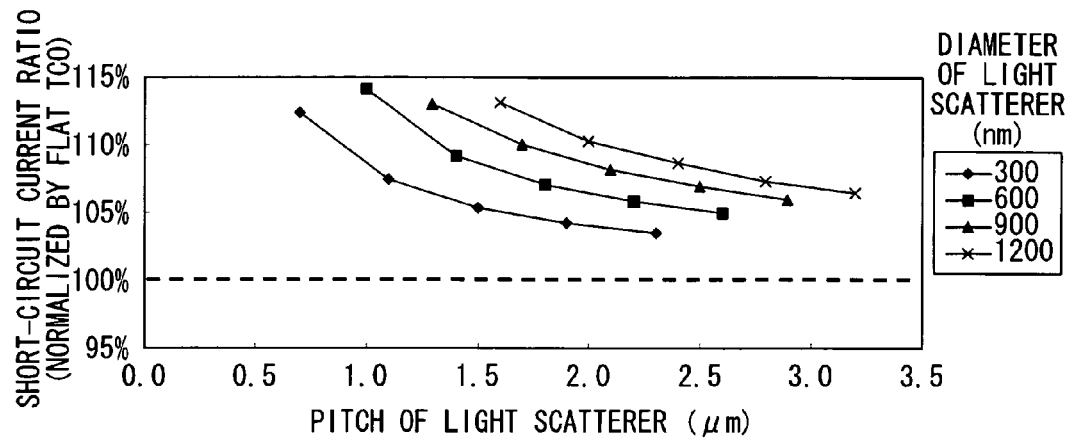
FIG. 22A is a graph showing the relationship between the pitch of the light scatterer and the short-circuit current ratio of the top cell, when the light scatterer is made of $TiO_2$ and the diameter thereof is in a range of 300 nm to 1200 nm.
Figure 22B:
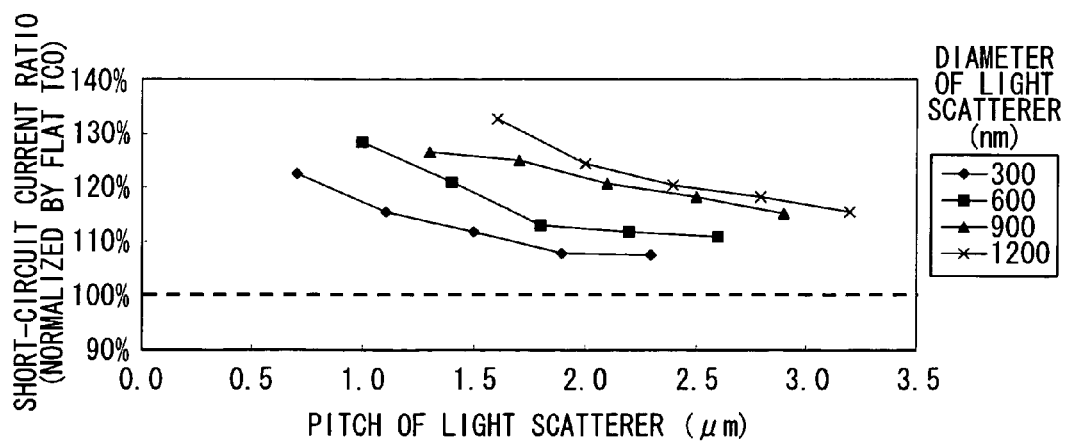
FIG. 22B is a graph showing the relationship between the pitch of the light scatterer and the short-circuit current ratio of the bottom cell, when the light scatterer is made of $TiO_2$ and the diameter thereof is in a range of 300 nm to 1200 nm.

FIGS. 21A, 21B, 22A, and 22B are graphs showing the relationship between the pitch and the diameter of the light scatterer 7 and the short-circuit current ratio in the tandem thin-film solar cell 10 using $TiO_2$ as the light scatterer 7. More in detail, FIG. 21A is a graph showing the relationship between the pitch of the light scatterer 7 and the short-circuit current ratio of the top cell 3 when the diameter of the light scatterer 7 is in a range of 60 nm to 600 nm. FIG. 21B is a graph showing the relationship between the pitch of the light scatterer 7 and the short-circuit current ratio of the bottom cell 4 when the diameter of the light scatterer 7 is in the range of 60 nm to 600 nm. In the graphs of FIGS. 21A and 21B, the layer thickness of the lower electrode layer 2 is assumed to be 0.7 μm. On the other hand, FIG. 22A is a graph showing the relationship between the pitch of the light scatterer 7 and the short-circuit current ratio of the top cell 3 when the diameter of the light scatterer 7 is in a range of 300 nm to 1200 nm. FIG. 22B is a graph showing the relationship between the pitch of the light scatterer 7 and the short-circuit current ratio of the bottom cell 4 when the diameter of the light scatterer 7 is in the range of 300 nm to 1200 nm. In the graphs of FIGS. 22A and 22B, the layer thickness of the lower electrode layer 2 is assumed to be 1.2 μm. It should be noted however, that a value of the short-circuit current ratio at the pitch value of "0 nm" is a value of the short-circuit current ratio in the case of a configuration in which continuous $TiO_2$ layers are provided to a surface of the lower electrode layer 2 on the side of the top cell 3, regarding all the graphs in FIGS. 21A, 21B, 22A, and 22B.

Regarding the top cell 3 and the bottom cell 4 both, the short-circuit current ratio exceeding 100% can be obtained by setting the diameter of the light scatterer 7 to a range of 60 nm to 1200 nm, and by further setting the pitch of the light scatterer 7 equal to or below two times 1200 nm, 1200 nm being the high value of the light wavelength region used for the power generation, that is, equal to or below 2400 nm, as is understood from FIGS. 21A, 21B, 22A, and 22B. This indicates that setting the diameter and the pitch of the light scatterer 7 to the above ranges is advantageous for the improvement of the conversion efficiency.

Figure 23A:
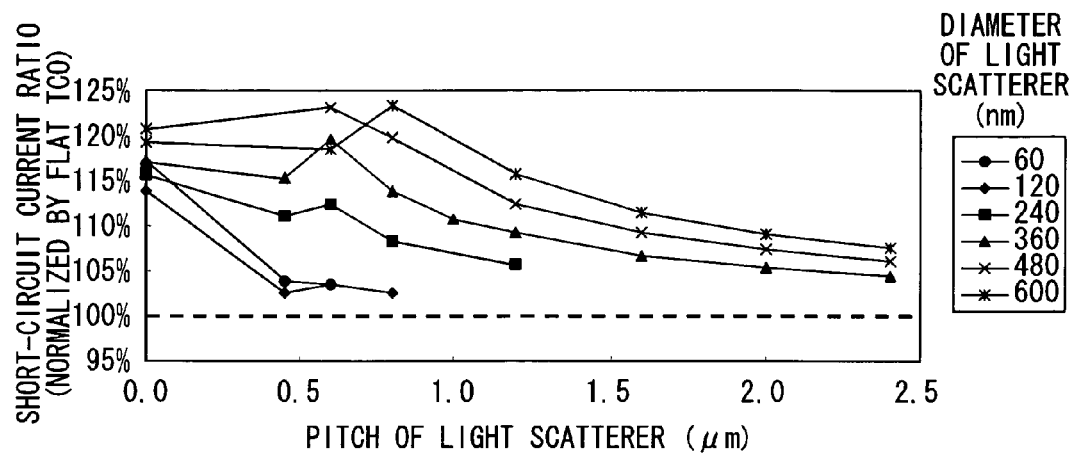
FIG. 23A is a graph showing the relationship between the pitch of the light scatterer and the short-circuit current ratio of the top cell, when the light scatterer is made of diamond and the diameter thereof is in a range of 60 nm to 600 nm.
Figure 23B:
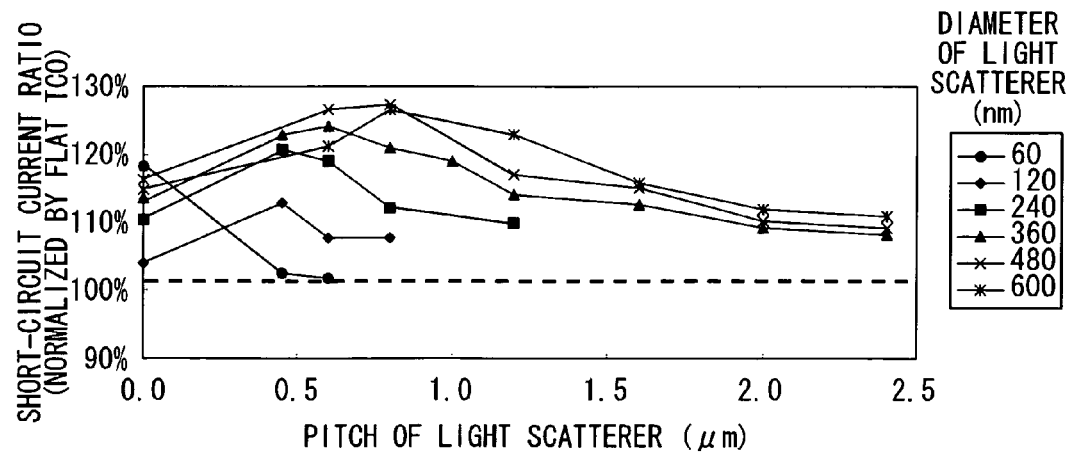
FIG. 23B is a graph showing the relationship between the pitch of the light scatterer and the short-circuit current ratio of the bottom cell, when the light scatterer is made of diamond and the diameter thereof is in a range of 60 nm to 600 nm.

The same applies to the case where the light scatterer 7 is formed by diamond. FIGS. 23A and 23B are graphs showing the relationship between the pitch and the diameter of the light scatterer 7 and the short-circuit current ratio in the tandem thin-film solar cell 10 using diamond as the light scatterer 7 in which the layer thickness of the lower electrode layer 2 is assumed to be 0.7 μm. More in detail, FIG. 23A is a graph showing the relationship between the pitch of the light scatterer 7 and the short-circuit current ratio of the top cell 3 when the diameter of the light scatterer 7 is in a range of 60 nm to 600 nm. FIG. 23B is a graph showing the relationship between the pitch of the light scatterer 7 and the short-circuit current ratio of the bottom cell 4 when the diameter of the light scatterer 7 is in the range of 60 nm to 600 nm.

As is understood from FIGS. 23a and 23B, the behaviors of the short-circuit current ratios of the top cell 3 and the bottom cell 4 when the light scatterer 7 is formed by diamond are approximately the same as those of the short-circuit current ratios of the top cell 3 and the bottom cell 4 when the light scatterer 7 is formed by $TiO_2$. This indicates that diamond can be selected as the material of the light scatterer 7.

It should be noted that the argument over FIGS. 21A, 21B, 22A, 22B, 23A, and 23B is applicable to the case where the light scatterer 7 is approximated by the spheroid. In the case where the light scatterer 7 is approximated by the spheroid (especially when the long axis thereof has a length of 2000 nm or above), the light-scattering performance of the light scatterer 7 is determined by a length of the short axis. Therefore, the data of FIGS. 21A, 21B, 22A, 22B, 23A, and 23B indicate the effectiveness of setting the outer diameter of the light scatterer 7 to a range of 60 nm to 1200 nm. It should be noted here, that the outer diamater of the light scatterer 7 is a parameter defined as a value two times the average distance d from a center rotation axis 7a to a surface of the light scatterer 7, as mentioned above.

Figure 24A:
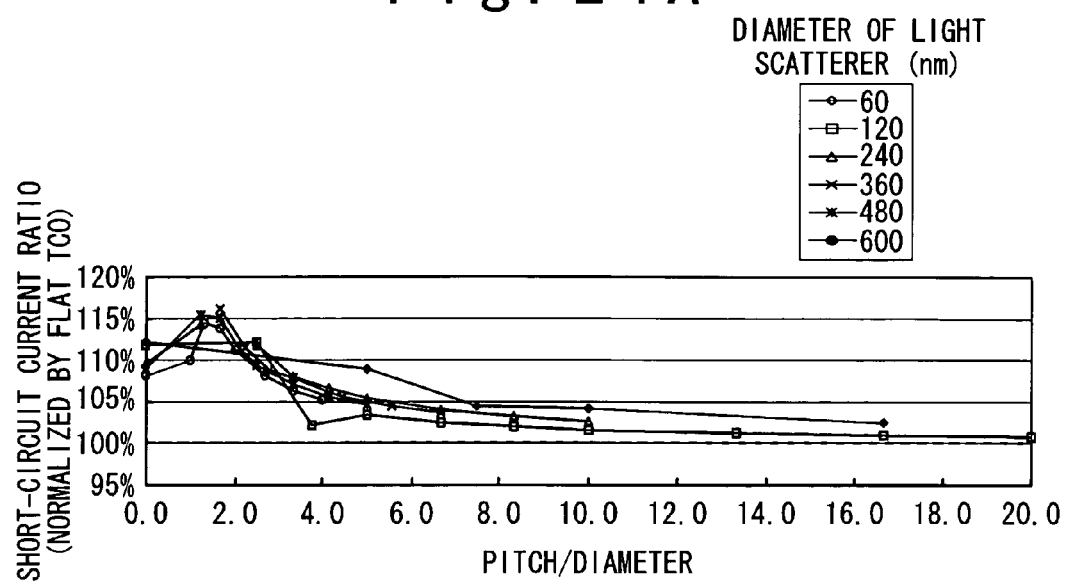
FIG. 24A is a graph showing the relationship between a ratio $\delta/d$ of the pitch $\delta$ to the diameter d of the light scatterer 7, and the short-circuit current ratio of the top cell.
Figure 24B:
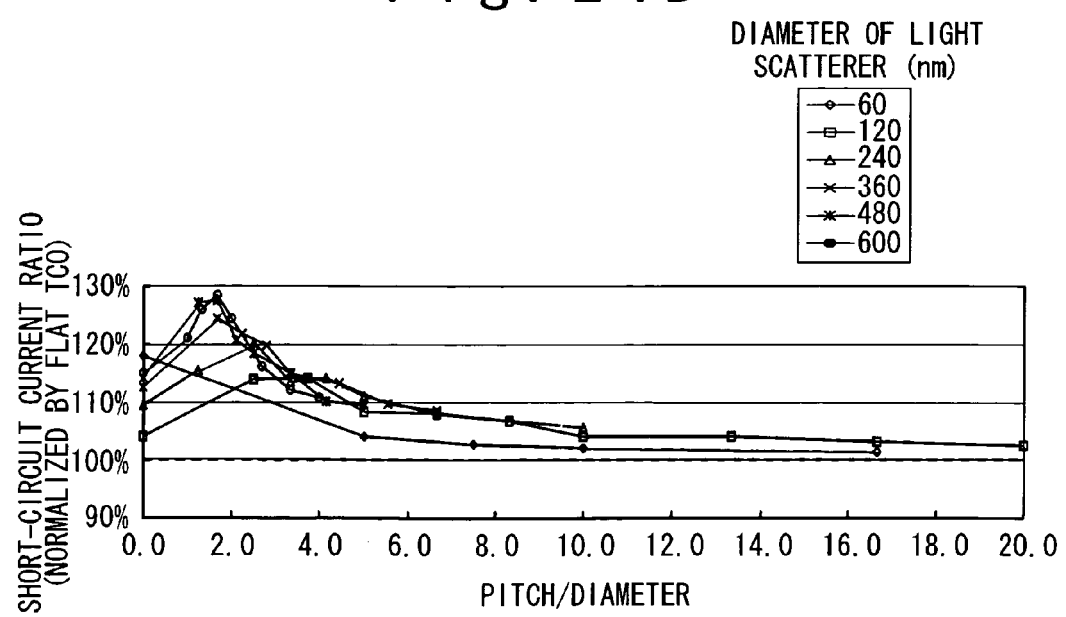
FIG. 24B is a graph showing the relationship between the ratio $\delta/d$ of the pitch $\delta$ to the diameter d of the light scatterer 7, and the short-circuit current ratio of the bottom cell.

FIGS. 24A and 24B are graphs showing the relationship between a ratio δ/d of the pitch δ to the diameter d of the light scatterer 7, and the short-circuit current ratio. More in detail, FIG. 24A shows the relationship between the ratio δ/d and the short-circuit current ratio of the top cell 3, and FIG. 24B shows the relationship between the ratio δ/d and the short-circuit current ratio of the bottom cell 4. The diameter of the light scatterer 7 is assumed to be in a range of 60 nm to 600 nm. Regarding both the top cell 3 and the bottom cell 4 too, the short-circuit current ratio exceeding 100% can be obtained by setting the ratio δ/d of the pitch δ to the diameter d of the light scatterer 7 to a value of 20 or below, to the extent that the diameter of the light scatterer 7 exceeds 60 nm.

Figure 25A:
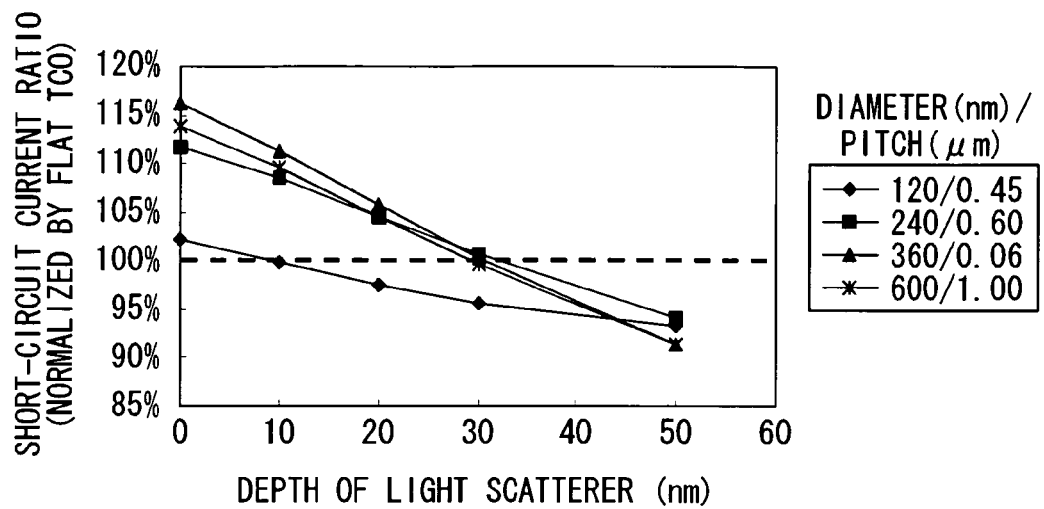
FIG. 25A is a graph showing the relationship between a depth of the light scatterer and the short-circuit current ratio of the top cell.
Figure 25B:
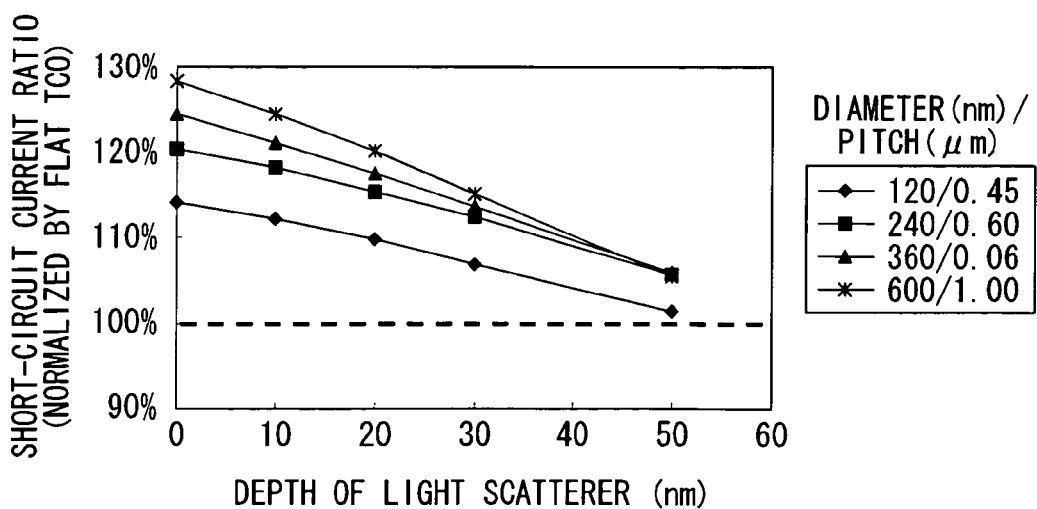
FIG. 25B is a graph showing the relationship between the depth of the light scatterer and the short-circuit current ratio of the bottom cell.

FIGS. 25A and 25B show the relationship between a distance from the surface 2a of the lower electrode 2 on the side of the top cell 3 to the light scatterer 7 (namely, the depth of the light scatterer 7), and the short-circuit current ratio. More in detail, FIG. 25A shows the relationship between the depth of the light scatterer 7 and the short-circuit current ratio of the top cell 3, and FIG. 25B shows the relationship between the depth of the light scatterer 7 and the short-circuit current ratio of the bottom cell 4. The diameter of the light scatterer 7 is selected among 120 nm, 240 nm, 360 nm, and 600 nm, and the pitch is selected such that the short-circuit current is maximized with respect to each diameter.

As is understood from FIGS. 25A and 25B, the shorter the depth of the light scatterer 7 is, the higher short-circuit current ratio can be obtained. As for the top cell 3, the short-circuit current ratio exceeding 100% can be obtained by setting the depth of the light scatterer 7 to 30 nm or below, as understood from FIG. 25A. As for the bottom cell 4 on the other hand, the short-circuit current ratio exceeding 100% can be obtained by setting the depth of the light scatterer 7 to 50 nm or below, as understood from FIG. 25B. FIGS. 25A and 25B show the effectiveness of setting the depth of the light scatterer 7 to 50 nm or below, preferably to 30 nm or below.

What is claimed is:

1. A light-scattering film comprising:
   a medium made of a transparent conductive material; and
   a light scatterer embedded in said medium,
   wherein a surface of said light-scattering film has an average value of an angle of 5 degrees or less, said angle being defined between an upper surface of said light-scattering film and a main surface of a substrate on which said light-scattering film is formed in any cross section having a length of 300 to 1200 nm in a direction parallel to said main surface of said substrate,
   wherein an average outer diameter of said light scatterer is in a range of 360 nm to 600 nm, said light scatterer is approximated by spheroid having a center rotation axis and said outer diameter is a value two times an average of a distance from said center rotation axis to a surface of said light scatterer,
   wherein an average of pitch of said light scatterer is 1.0 μm or below, and
   said pitch of said light scatterer is a distance between two adjacent members of said light scatterer, and
   wherein the light scatterer is disposed so as not to overlap another light scatterer in the medium when viewed in a direction perpendicular to the substrate.

2. The light-scattering film according to claim 1, wherein a difference between relative refractive index of said medium and relative refractive index of said light scatterer is 2.0 or below.

3. The light-scattering film according to claim 1, wherein said light scatterer is made of insulating material.

4. The light-scattering film according to claim 3, wherein said light scatterer includes titanium oxide, diamond, SiO2, MgF2, MgO, ZnO or LiTaO3.

5. The light-scattering film according to claim 3, wherein said light scatterer includes:
   a first scatterer; and
   a second scatterer having relative refractive index which is different to relative refractive index of said first scatterer.

6. The light-scattering film according to claim 1, wherein a difference between maximum value and minimum value of said pitch of said light scatterer is 120 nm or below.

7. The light-scattering film according to claim 1, wherein a distance from said surface of said medium to said light scatterer is 50 nm or below.

8. The light-scattering film according to claim 7, wherein said distance is 30 nm or below.

9. The light-scattering film according to claim 1, wherein said light scatterer is in contact with said surface of said medium.

10. A photoelectric conversion device comprising:
a substrate; and
an electrode layer placed on an upper side of said substrate, wherein said electrode layer includes:
a first medium made of a transparent conductive material; and
a light scatterer embedded in said first medium,
wherein a surface of said medium has an average value of an angle of 5 degrees or less, said angle being defined between an upper surface of said electrode layer and a main surface of said substrate in any cross section having a length of 300 nm to 1200 nm in a direction parallel to said main surface of said substrate,
wherein an average outer diameter of said light scatterer is in a range of 360 nm to 600 nm, said light scatterer is approximated by a spheroid having a center rotation axis and said outer diameter is a value two times an average of a distance from said center rotation axis to a surface of said light scatterer,
wherein an average of pitch of said light scatterer is 1.0 μm or below, and
said pitch of said light scatterer is a distance between two adjacent members of said light scatterer, and
wherein the light scatterer is disposed so as not to overlap another light scatterer in the medium when viewed in a direction perpendicular to the substrate.

11. The photoelectric conversion device according to claim 10, further comprising:
a first semiconductor layer placed between said substrate and said electrode layer; and
a second semiconductor layer placed on said electrode layer.

12. The photoelectric conversion device according to claim 10, wherein said electrode layer is in contact with said substrate.

13. The photoelectric conversion device according to claim 12, further comprising:
a first semiconductor layer placed on said electrode layer.

14. The photoelectric conversion device according to claim 10, wherein a difference between relative refractive index of said first medium and relative refractive index of said light scatterer is 2.0 or below.

15. The photoelectric conversion device according to claim 10, wherein said light scatterer is made of insulating material.

16. The photoelectric conversion device according to claim 15, wherein said light scatterer includes titanium oxide, diamond, SiO2, MgF2, MgO, ZnO or LiTaO3.

17. The photoelectric conversion device according to claim 10, wherein said light scatterer includes:
a first light scatterer; and
a second scatterer having relative refractive index which is different to relative refractive index of said first scatterer.

18. The photoelectric conversion device according to claim 10, wherein a difference between maximum value and minimum value of said pitch of said light scatterer is 120 nm or below.

19. The photoelectric conversion device according to claim 10, wherein a distance from said surface of said medium to said light scatterer is 50 nm or below.

20. The photoelectric conversion device according to claim 10, wherein a distance from said surface of said medium to said light scatterer is 30 nm or below.

21. The photoelectric conversion device according to claim 10, wherein said light scatterer is in contact with said surface of said medium.

22. The photoelectric conversion device according to claim 13, further comprising:
an intermediate layer placed on said first semiconductor layer; and
a second semiconductor layer placed on said intermediate layer,
wherein said intermediate layer includes:
a second medium made of a conductive material; and
a light scatterer embedded in said second medium.

23. The photoelectric conversion device according to claim 22, wherein a surface of said intermediate layer contacting with said second semiconductor layer is substantially flat.

24. The photoelectric conversion device according to claim 13, further comprising:
an upper electrode layer placed on the upper side of said first semiconductor layer,
wherein said upper electrode layer includes:
a third medium made of conductive material; and
a light scatterer embedded in said third medium.

25. The photoelectric conversion device according to claim 13, wherein said first semiconductor layer includes silicon, SiC or SiGe.

26. A light-scattering film comprising:
a medium made of a transparent conductive material; and
a light scatterer embedded in said medium,
wherein a surface of said light-scattering film has an average value of an angle of 5 degrees or less, said angle being defined between an upper surface of said light-scattering film and a main surface of a substrate on which said light-scattering film is formed in any cross section having a length of 300 to 1200 nm in a direction parallel to said main surface of said substrate,
wherein an average diameter of said light scatterer is in a range of 360 nm to 600 nm, said diameter of said light scatterer is a value two times an average of distance from a center of said light scatterer to a surface of said light scatterer,
wherein an average of pitch of said light scatterer is 1.0 μm or below, said pitch of said light scatterer is a distance between adjacent two members of said light scatterer, and
wherein the light scatterer is disposed so as not to overlap another light scatterer in the medium when viewed in a direction perpendicular to the substrate.

27. The light-scattering film according to claim 26, wherein a difference between maximum value and minimum value is 120 nm or below.

28. A light-scattering film comprising:
a medium made of a transparent conductive material; and
a light scatterer embedded in said medium,
wherein a surface of said light-scattering film has an average value of an angle of 5 degrees or less, said angle being defined between an upper surface of said light-scattering film and a main surface of a substrate on which said light-scattering film is formed in any cross section having a length of 300 to 1200 nm in a direction parallel to said main surface of said substrate,
wherein a ratio of $\delta_{AVE}/d_{AVE}$ of an average pitch of said light scatterer $\delta_{AVE}$ to an average diameter $d_{AVE}$ of the light scatterer is not less than 1.67 and not more than 2.5, said average pitch of said light scatterer is an average of pitch defined as a distance between centers of adjacent members of said light scatterers, said average diameter of said light scatterer is two times an average of distance from a center to a surface of said light scatterer, and wherein the light scatterer is disposed so as not to overlap another light scatterer in the medium when viewed in a direction perpendicular to the substrate.

29. A photoelectric conversion device comprising:

a substrate; and an electrode layer placed in an upper side of said substrate, wherein said electrode layer includes:

a first medium made of a transparent conductive material; and a light scatterer embedded in said first medium, wherein a surface of said medium has an average value of an angle of 5 degrees or less, said angle being defined between an upper surface of said electrode layer and a main surface of said substrate in any cross section having a length of 300 to 1200 nm in a direction parallel to said main surface of said substrate, wherein an average of diameter of said light scatterer is in a range of 360 to 600 nm, said diameter of said light scatterer is a value two times an average of a distance from a center of said light scatterer to a surface of said light scatterer, wherein an average of pitch of said light scatterer is 1.0 µm or below, and said pitch of said light scatterer is a distance between two adjacent members of said light scatterer, and wherein the light scatterer is disposed so as not to overlap another light scatterer in the first medium when viewed in a direction perpendicular to the substrate.

30. The photoelectric conversion device according to claim 29, wherein a difference between maximum value and minimum value is 120 nm or below.

31. A photoelectric conversion device comprising:

a substrate; and an electrode layer placed in an upper side of said substrate, wherein said electrode layer includes:

a first medium made of a transparent conductive material; and a light scatterer embedded in said light medium, wherein a surface of said medium has an average value of an angle of 5 degrees or less, said angle being defined between an upper surface of said electrode layer and a main surface of said substrate in any cross section having a length of 300 to 1200 nm in a direction parallel to said main surface of said substrate, wherein a ratio $\delta_{AVE}/d_{AVE}$ of an average pitch of said light scatterer $\delta_{AVE}$ to an average diameter $d_{AVE}$ of the light scatterer is not less than 1.67 and not more than 2.5, said average pitch of said light scatterer is an average of pitch defined as a distance between centers of adjacent members of said light scatterers, said average diameter of said light scatterer is two times an average of distance from a center to a surface of said light scatterer, and wherein the light scatterer is disposed so as not to overlap another light scatterer in the first medium when viewed in a direction perpendicular to the substrate.

* * * * *